(12) United States Patent
Limarga et al.

(10) Patent No.: US 12,710,792 B2
(45) Date of Patent: Aug. 18, 2026

(54) ELECTRONIC DEVICE ENCLOSURE HAVING A TEXTURED GLASS COMPONENT

(71) Applicant: Apple Inc., Cupertino, CA (US)

(72) Inventors: Andi M. Limarga, Cupertino, CA (US); James R. Wilson, Cupertino, CA (US); Matthew S. Rogers, San Jose, CA (US); Que Anh S. Nguyen, San Jose, CA (US); Bijumon Varkey, San Jose, CA (US)

(73) Assignee: Apple Inc., Cupertino, CA (US)

(*) Notice: Subject to any disclaimer, the term of this patent is extended or adjusted under 35 U.S.C. 154(b) by 360 days.

(21) Appl. No.: 18/388,700

(22) Filed: Nov. 10, 2023

(65) Prior Publication Data

US 2024/0081011 A1 Mar. 7, 2024

Related U.S. Application Data

(63) Continuation of application No. 17/843,854, filed on Jun. 17, 2022, which is a continuation of application
(Continued)

(51) Int. Cl.
*H04M 1/02* (2006.01)
*C03C 15/00* (2006.01)
(Continued)

(52) U.S. Cl.
CPC ............ *G06F 1/1656* (2013.01); *C03C 15/00* (2013.01); *C03C 17/3602* (2013.01);
(Continued)

(58) Field of Classification Search
CPC .... G06F 1/1656; G06F 1/1616; G06F 1/1637; G06F 3/0443; G06F 1/1626;
(Continued)

(56) References Cited

U.S. PATENT DOCUMENTS 4,633,323 A 12/1986 Haberkern et al.
5,476,821 A 12/1995 Beall et al.
(Continued)

FOREIGN PATENT DOCUMENTS

CN 101712102 5/2010
CN 203013800 6/2013
(Continued)

OTHER PUBLICATIONS

Author Unknown, "LG's Future Display Technology Will Blow You Away," Techno Source, https://www.youtube.com/watch?v=qIRjytgNuhM, 2 pages, May 2, 2017.
(Continued)

*Primary Examiner* — Andrew Wendell
(74) *Attorney, Agent, or Firm* — Brownstein Hyatt Farber Schreck, LLP

(57) ABSTRACT

Textured cover assemblies for electronic devices are disclosed. The textured cover assemblies may provide a combination of optical and tactile properties to the electronic devices. In some cases, a textured cover assembly may be provided over decorative coating.

20 Claims, 14 Drawing Sheets

Related U.S. Application Data

No. 17/032,813, filed on Sep. 25, 2020, now Pat. No. 11,369,028, which is a continuation of application No. 16/564,244, filed on Sep. 9, 2019, now Pat. No. 10,827,635.

(60) Provisional application No. 62/857,613, filed on Jun. 5, 2019.

(51) Int. Cl.

| | |
|---|---|
| ***C03C 17/36*** | (2006.01) |
| ***C03C 17/38*** | (2006.01) |
| ***C03C 19/00*** | (2006.01) |
| ***C03C 21/00*** | (2006.01) |
| ***G02B 1/18*** | (2015.01) |
| ***G06F 1/16*** | (2006.01) |
| ***G06F 3/044*** | (2006.01) |
| ***H04B 1/03*** | (2006.01) |
| ***H05K 5/02*** | (2006.01) |
| ***H05K 5/03*** | (2006.01) |

(52) U.S. Cl.

CPC .............. *C03C 17/38* (2013.01); *C03C 19/00* (2013.01); *C03C 21/002* (2013.01); *G02B 1/18* (2015.01); *G06F 1/1616* (2013.01); *G06F 1/1637* (2013.01); *G06F 3/0443* (2019.05); *H04M 1/0266* (2013.01); *H05K 5/0243* (2013.01); *H05K 5/03* (2013.01); *C03C 2217/72* (2013.01)

(58) Field of Classification Search

CPC ........... G06F 2203/04809; C03C 15/00; C03C 17/3602; C03C 17/38; C03C 19/00; C03C 21/002; C03C 2217/72; C03C 17/28; C03C 17/36; G02B 1/18; H05K 5/0243; H05K 5/03; H05K 5/0018; B24C 1/04; B24C 1/06; H04M 1/0266; H04M 1/0202; H04M 1/0283; H04M 1/0264; H04M 1/02; H04M 1/03; H04B 1/03

See application file for complete search history.

(56) References Cited

U.S. PATENT DOCUMENTS 6,068,891 A 5/2000 O'Dell et al.
6,229,697 B1 5/2001 Selker
6,677,703 B2 1/2004 Ito et al.
6,762,931 B2 7/2004 Chen
7,297,386 B2 11/2007 Suzuki et al.
7,646,143 B2 1/2010 Kimura et al.
8,092,911 B2 1/2012 Sakoske et al.
8,106,787 B2 1/2012 Nurmi
8,184,373 B2 5/2012 Tanaka et al.
8,213,085 B2 7/2012 Liu et al.
8,553,333 B2 10/2013 Chang et al.
8,576,561 B2 11/2013 Myers et al.
8,603,372 B2 12/2013 Tanaka et al.
8,681,113 B1 3/2014 Wu et al.
8,771,532 B2 7/2014 Carlson et al.
8,872,295 B2 10/2014 Hermans et al.
8,896,802 B2 11/2014 Yoneyama et al.
8,953,083 B2 2/2015 Hedge
9,017,566 B2 4/2015 Lander et al.
9,034,166 B2 5/2015 Tatebe et al.
9,154,678 B2 10/2015 Kwong et al.
9,239,594 B2 1/2016 Lee et al.
9,240,498 B2 1/2016 Fujita et al.
9,262,002 B2 2/2016 Momeyer et al.
9,377,603 B1 6/2016 Cheng et al.
9,448,713 B2 9/2016 Cruz-Hernandez et al.
9,554,482 B2 1/2017 Wilson et al.
9,644,281 B2 5/2017 Tatebe et al.
9,658,500 B2 5/2017 Iwamoto
9,720,141 B1 8/2017 Cheng et al.
9,732,237 B2 8/2017 Sugamoto et al.
9,745,221 B2 8/2017 Ehrensperger et al.
9,862,124 B2 1/2018 Radcliffe et al.
9,875,718 B1 1/2018 Basehore et al.
9,880,327 B2 1/2018 Park et al.
9,938,186 B2 4/2018 Moll et al.
9,961,337 B2 5/2018 Stroetmann
10,013,020 B2 7/2018 Hong et al.
10,043,052 B2 8/2018 Wickboldt et al.
10,101,583 B2 10/2018 Saenger Nayver et al.
10,171,636 B2 1/2019 Yeo et al.
10,214,445 B2 2/2019 Hart et al.
10,298,824 B2 5/2019 Lee et al.
10,333,576 B2 * 6/2019 Evans, V ............. H04B 1/3818
10,442,151 B2 10/2019 Ozeki et al.
10,647,032 B2 5/2020 Radcliffe et al.
10,676,393 B2 6/2020 Weber et al.
10,690,818 B2 6/2020 Chen et al.
10,694,010 B2 6/2020 Jones
10,781,135 B2 9/2020 Weber et al.
10,827,635 B1 11/2020 Limarga et al.
10,843,439 B2 11/2020 Gulati et al.
10,866,616 B2 12/2020 Seo et al.
10,917,505 B2 2/2021 Jones
10,948,633 B2 3/2021 Murakami et al.
11,109,500 B2 8/2021 Shannon et al.
11,112,827 B2 9/2021 Hendren et al.
11,192,823 B2 12/2021 Li et al.
11,199,929 B2 12/2021 Poole et al.
11,369,028 B2 6/2022 Limarga et al.
11,372,137 B2 6/2022 Gu et al.
11,397,449 B2 7/2022 Hendren et al.
11,402,669 B2 8/2022 Poole et al.
11,533,817 B2 * 12/2022 Shannon ............... G06F 1/1656
11,691,912 B2 7/2023 Poole et al.
12,481,318 B2 11/2025 Hendren et al.
2002/0127565 A1 9/2002 Cunningham
2003/0011315 A1 1/2003 Ito et al.
2005/0266250 A1 12/2005 Hayakawa
2006/0024508 A1 2/2006 D'Urso et al.
2006/0034042 A1 2/2006 Hisano et al.
2007/0048513 A1 3/2007 Okamoto et al.
2007/0195419 A1 8/2007 Tsuda et al.
2009/0257207 A1 10/2009 Wang et al.
2010/0243295 A1 * 9/2010 Allemand ............. H10F 77/244
174/250
2011/0187245 A1 * 8/2011 Pakula ..................... H05K 5/03
312/223.1
2012/0025245 A1 2/2012 Nakamura et al.
2012/0127755 A1 5/2012 Shiau et al.
2012/0194974 A1 8/2012 Weber et al.
2012/0218640 A1 8/2012 Gollier et al.
2012/0274565 A1 11/2012 Moser et al.
2013/0026593 A1 1/2013 Hermans et al.
2013/0215513 A1 8/2013 Liang et al.
2013/0235462 A1 9/2013 Haas
2013/0273324 A1 10/2013 Moll et al.
2013/0296155 A1 11/2013 Beall et al.
2014/0035869 A1 2/2014 Yun et al.
2014/0063609 A1 3/2014 Iwata et al.
2014/0098075 A1 4/2014 Kwak et al.
2014/0106127 A1 4/2014 Lyons et al.
2014/0327643 A1 11/2014 Sun et al.
2015/0090689 A1 4/2015 Guilfoyle et al.
2015/0174625 A1 6/2015 Hart et al.
2015/0229745 A1 * 8/2015 De Wind ............ H04M 1/0266
455/575.8
2016/0113135 A1 * 4/2016 Kim .......................... B32B 3/04
361/679.01
2016/0154435 A1 6/2016 Yanagisawa et al.
2016/0188181 A1 6/2016 Smith et al.
2016/0224822 A1 8/2016 Hasegawa et al.
2016/0283014 A1 9/2016 Rider et al.
2016/0306390 A1 10/2016 Vertegaal et al.
2016/0357318 A1 12/2016 Chan et al.
2017/0013731 A1 * 1/2017 Lee ...................... H05K 5/0217
2017/0026553 A1 1/2017 Lee et al.

(56) References Cited

U.S. PATENT DOCUMENTS

| | | | |
|---|---|---|---|
| 2017/0058130 | A1 | 3/2017 | Addleman et al. |
| 2017/0097535 | A1 | 4/2017 | Andou et al. |
| 2017/0176246 | A1 | 6/2017 | Jia et al. |
| 2017/0184764 | A1 | 6/2017 | Matsuyuki et al. |
| 2017/0276618 | A1 | 9/2017 | Takagi |
| 2017/0285227 | A1 | 10/2017 | Chen et al. |
| 2017/0308234 | A1 | 10/2017 | Li et al. |
| 2018/0030765 | A1 | 2/2018 | Kessler et al. |
| 2018/0042131 | A1 | 2/2018 | Liu et al. |
| 2018/0059718 | A1 | 3/2018 | Ramaswamy et al. |
| 2018/0077810 | A1 | 3/2018 | Moon et al. |
| 2018/0086662 | A1 | 3/2018 | Luzzato et al. |
| 2018/0162091 | A1 | 6/2018 | Takeda et al. |
| 2018/0162768 | A1 | 6/2018 | Boek et al. |
| 2018/0215657 | A1 | 8/2018 | Jin et al. |
| 2018/0278730 | A1* | 9/2018 | Saeed ................ G06Q 20/3224 |
| 2018/0282201 | A1 | 10/2018 | Hancock et al. |
| 2018/0343438 | A1* | 11/2018 | Cho ................... G01B 11/2513 |
| 2018/0343755 | A1 | 11/2018 | Park et al. |
| 2018/0352668 | A1 | 12/2018 | Amin et al. |
| 2019/0032237 | A1 | 1/2019 | Kim et al. |
| 2019/0037690 | A1 | 1/2019 | Wilson et al. |
| 2019/0041909 | A1 | 2/2019 | Pakula et al. |
| 2019/0098121 | A1* | 3/2019 | Jeon ...................... H04M 1/026 |
| 2019/0155339 | A1 | 5/2019 | Fenton et al. |
| 2019/0230204 | A1 | 7/2019 | Zhang |
| 2019/0236887 | A1 | 8/2019 | Rich et al. |
| 2019/0241455 | A1 | 8/2019 | Sweney et al. |
| 2019/0246018 | A1 | 8/2019 | Rho et al. |
| 2019/0253543 | A1* | 8/2019 | Fan ...................... H05K 5/0086 |
| 2019/0256410 | A1 | 8/2019 | Isshiki et al. |
| 2020/0026327 | A1 | 1/2020 | Hendren et al. |
| 2020/0050829 | A1* | 2/2020 | Akcasu .............. G06V 40/1365 |
| 2020/0128233 | A1* | 4/2020 | Jannard ................ H04N 13/398 |
| 2020/0189966 | A1 | 6/2020 | Lee et al. |
| 2020/0199020 | A1 | 6/2020 | Hatano et al. |
| 2020/0231494 | A1* | 7/2020 | Zheng ....................... B44C 3/02 |
| 2020/0257339 | A1* | 8/2020 | Kameda ................ B32B 27/308 |
| 2020/0389991 | A1 | 12/2020 | Shannon et al. |
| 2022/0071039 | A1 | 3/2022 | Limarga et al. |
| 2022/0322557 | A1 | 10/2022 | Limarga et al. |
| 2022/0326413 | A1 | 10/2022 | Gu et al. |
| 2022/0357773 | A1 | 11/2022 | Hendren et al. |
| 2023/0014168 | A1 | 1/2023 | Poole et al. |
| 2023/0124179 | A1 | 4/2023 | Shannon et al. |
| 2024/0069595 | A1 | 2/2024 | Hendren et al. |
| 2024/0081010 | A1 | 3/2024 | Shannon et al. |
| 2024/0083805 | A1 | 3/2024 | Limarga et al. |
| 2024/0184336 | A1 | 6/2024 | Poole et al. |
| 2025/0120030 | A1 | 4/2025 | Shannon et al. |
| 2025/0162928 | A1 | 5/2025 | Limarga et al. |
| 2026/0072470 | A1 | 3/2026 | Hendren et al. |

FOREIGN PATENT DOCUMENTS

| | | |
|---|---|---|
| CN | 103425243 | 12/2013 |
| CN | 103502166 | 1/2014 |
| CN | 203406929 | 1/2014 |
| CN | 103702773 | 4/2014 |
| CN | 104024929 | 9/2014 |
| CN | 104321693 | 1/2015 |
| CN | 104583147 | 4/2015 |
| CN | 104981728 | 10/2015 |
| CN | 105283322 | 1/2016 |
| CN | 105359064 | 2/2016 |
| CN | 105988509 | 10/2016 |
| CN | 106155193 | 11/2016 |
| CN | 107438494 | 12/2017 |
| CN | 207070526 | 3/2018 |
| CN | 107911964 | 4/2018 |
| CN | 107924002 | 4/2018 |
| CN | 10832510 | 10/2018 |
| CN | 207992872 | 10/2018 |
| CN | 109202296 | 1/2019 |
| CN | 208433428 | 1/2019 |
| CN | 208461858 | 2/2019 |
| CN | 109547679 | 3/2019 |
| CN | 109640557 | 4/2019 |
| CN | 110713351 | 1/2020 |
| CN | 107683055 | 9/2022 |
| DE | 10223165 | 12/2003 |
| EP | 3454541 | 3/2019 |
| JP | 2011510904 | 4/2011 |
| JP | 2013242725 | 12/2013 |
| JP | 2016045824 | 4/2016 |
| JP | 2017508178 | 3/2017 |
| JP | 2018506851 | 3/2018 |
| KR | 20130127842 | 11/2013 |
| KR | 20160145081 | 12/2016 |
| KR | 20170076779 | 7/2017 |
| KR | 20180018782 | 2/2018 |
| TW | 201910882 | 3/2019 |
| WO | WO2014/011328 | 1/2014 |
| WO | WO2014/012003 | 1/2014 |
| WO | WO2015/191949 | 12/2015 |
| WO | WO2016/088983 | 6/2016 |
| WO | WO2016/196615 | 12/2016 |
| WO | WO2017/038868 | 3/2017 |
| WO | WO2019/027675 | 2/2019 |

OTHER PUBLICATIONS

Ben-Yakar et al., "Femtosecond laser ablation properties of borosilicate glass," Journal of Applied Physics, vol. 96, No. 9, 8 pages, Nov. 1, 2004.

Hedayati et al., Antireflective Coatings: Conventional Stacking Layers and Ultrathin Plasmonic Metasurfaces, A Mini-Review, Materials, vol. 9, No. 497, 2016.

Qi et al., "Simple Approach to Wafer-Scale Self-Cleaning Antireflective Silicon Surfaces," American Chemical Society, State Key Laboratory of Supramolecular Structure and Materials, College of Chemistry, Jilin University, Changchun 130012, P.R. China, 2009.

Seth, Radhika, "A Fresh New Look at the Computer," https://www.yankodesign.com/2009/02/06/a-fresh-new-look-at-the-computer, 1 page, Feb. 6, 2009.

Tan et al., "Broadband antireflection film with moth-eye-like structure for flexible display applications," Optica, vol. 4, No. 7, pp. 678-683, Jul. 2017.

Wimmer, "Curve: Revisiting the Digital Desk," NordiCHI '10: Proceedings of the 6th Nordic Conference on Human-Computer Interaction: Extending Boundaries, https://doi.org/10.1145/1868914.1868977, http://www.mmi.ifi.lmu.de/pubdb/publications/pub/wimmer2010Curve/wimmer2010Curve.pdf, https://dl.acm.org/doi/10.1145/1868914.1868977, pp. 561-570, Oct. 2010.

* cited by examiner

ELECTRONIC DEVICE ENCLOSURE HAVING A TEXTURED GLASS COMPONENT

CROSS-REFERENCE TO RELATED APPLICATION(S)

This application is a continuation patent application of U.S. patent application Ser. No. 17/843,854, filed Jun. 17, 2022 and titled "Electronic Device Enclosure Having a Textured Glass Component," which is a continuation patent application of U.S. patent application Ser. No. 17/032,813, filed Sep. 25, 2020 and titled "Electronic Device Enclosure Having a Textured Glass Component," now U.S. Pat. No. 11,369,028, which is a continuation patent application of U.S. patent application Ser. No. 16/564,244, filed Sep. 9, 2019 and titled "Electronic Device Enclosure Having a Textured Glass Component," now U.S. Pat. No. 10,827,635, which is a nonprovisional patent application of and claims the benefit of U.S. Provisional Patent Application No. 62/857,613, filed Jun. 5, 2019, and titled "Electronic Device Enclosure Having a Textured Glass Component," the disclosures of which are hereby incorporated by reference herein in their entireties.

FIELD

The described embodiments relate generally to electronic device enclosures that include textured glass components. More particularly, the present embodiments relate to textured cover glass, cover assemblies, and enclosures for an electronic device.

BACKGROUND

Enclosures for electronic devices may traditionally be formed from a variety of components. Enclosures should be durable as well as provide a suitable feel in the hand of the user. Some traditional enclosures are formed from plastic or other molded materials, which may be shaped and textured using a molding or other similar forming technique. However, it may be more difficult to texture or shape enclosure components formed from different non-plastic materials. For example, it may be difficult to form a texture or shape of an enclosure component formed from a material like glass or ceramic. The techniques and articles described herein are directed to forming a texture and other surface features on a glass component of an enclosure.

SUMMARY

Textured glass components for electronic devices are disclosed herein. A glass component such as a glass cover member may have a texture configured to provide a desired appearance to an exterior surface of the electronic device. For example, a glass cover member may have a texture configured to provide a particular gloss level while minimizing less desirable visual effects. The texture may also be configured to provide a particular "feel" to the electronic device, to be readily cleaned, or both.

The texture may be configured to provide particular optical properties to the glass component. In some cases, the texture may be configured to provide particular levels of transmissive haze, clarity, gloss, graininess, or combinations thereof. For example, a decorative coating viewed through a textured glass cover member having a low graininess value may have a substantially uniform appearance.

An exterior surface of a glass component may define a textured region including surface features configured to provide the desired optical and other properties. A textured glass cover member may be included in a cover assembly for an electronic device enclosure. The cover assembly may further include a smudge-resistant coating provided over the surface features, a decorative coating disposed along an interior surface of glass cover member, or a combination thereof.

The disclosure provides an electronic device comprising a display and an enclosure at least partially surrounding the display and at least partially defining an internal volume of the electronic device. The enclosure includes a cover assembly comprising a glass cover member having an exterior surface defining a textured region including surface features having a ratio of a mean amplitude to a mean spacing ranging from about 0.01 to about 0.3, the textured region having a transmissive haze ranging from about 50% to about 90% and a graininess less than about 1.5 along the textured region The cover assembly may be a rear cover assembly defining a rear surface of the electronic device and the glass cover member may be a rear glass cover member. The rear cover assembly may further comprise a multilayer decorative coating visible through the rear glass cover member. In some embodiments, the mean amplitude of the surface features is characterized by a root mean square height (Sq) and the mean spacing of the surface features is characterized by a mean pitch of a set of peaks defined by the surface features.

The disclosure also provides an electronic device comprising a housing and a cover assembly coupled to the housing and including a glass cover member. The glass cover member has an exterior surface defining a textured region, the textured region having a clarity value ranging from about 5% to about 30% and the textured region including a set of peaks and valleys comprising a mean pitch between adjacent peaks ranging from about 5 microns to about 15 microns, a root mean square height (Sq) ranging from about 0.25 microns to about 1.5 microns, and a mean peak curvature (Ssc) ranging from about 0.5 $\text{microns}^{-1}$ to about 2 $\text{microns}^{-1}$.

The disclosure also provides an electronic device comprising a housing, a display positioned at least partially within the housing, a first cover assembly coupled to the housing, defining a transparent portion positioned over the display, and including a first glass cover member, and a second cover assembly coupled to the housing. The second cover assembly includes a second glass cover member having a textured exterior surface defining an irregular set of hills and valleys having a mean peak spacing from about 5 microns to about 20 microns and a root mean square slope (Sdq) from about 0.1 to less than about 1. In addition, the second glass cover member has a gloss value from about 5 gloss units to about 20 gloss units as measured at 60 degrees.

BRIEF DESCRIPTION OF THE DRAWINGS

The disclosure will be readily understood by the following detailed description in conjunction with the accompanying drawings, wherein like reference numerals designate like elements.

Figure 1A:
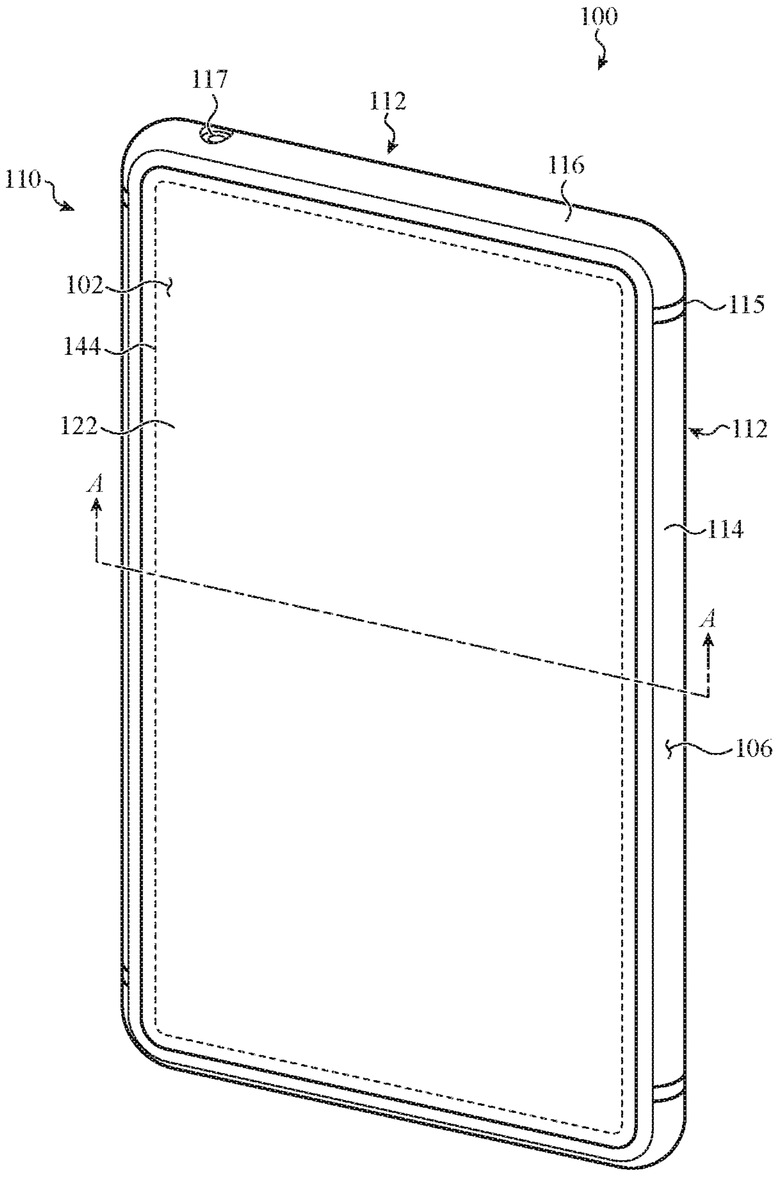
FIG. 1A shows a front view of an example electronic device including a textured glass component.

The use of cross-hatching or shading in the accompanying figures is generally provided to clarify the boundaries between adjacent elements and also to facilitate legibility of the FIGURES. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying FIGURES.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to textured glass components for electronic devices. The texture of a glass component such as a glass cover member may be configured to provide a desired appearance to an exterior surface of an electronic device. In addition, the texture may be configured to provide a particular "feel" to the electronic device, to be readily cleaned, or both. The textured glass component may be chemically strengthened to enhance its resistance to impact.

In some embodiments, a glass component may have a texture configured to provide certain properties while minimizing other properties which are less desirable. For example, it may be preferred that the texture does not produce an undesirable amount of visual contrast variation and/or visual texture. In addition, it may be preferred that surface features defining the texture are not individually visually perceptible. In some cases, the texture may cause the glass component to appear translucent, rather than transparent. The texture may be configured to provide particular levels of such optical properties such as transmissive haze, clarity, gloss, graininess, and combinations thereof.

In some embodiments, the texture is configured to minimize some visual effects when a decorative coating is viewed through the texture. For example, the texture may be configured to minimize perceived variations in lightness and darkness of a decorative coating viewed through the glass cover member. If these variations are not controlled, the decorative coating may appear to lack uniformity and may appear undesirably grainy or mottled. Similarly, a metallic marking included in the decorative coating may have a non-uniform appearance if these variations are not controlled. In addition, the texture may be configured so that images or graphics formed in the decorative coating are not overly distorted.

A textured region of a glass cover member may produce a visual contrast variation less than a specified value, such as a threshold value for visual perception. In some embodiments the graininess, which relates to a perceived variation in lightness and darkness across a surface, may be less than a specified value. For example, the graininess may be less than about 1.5, less than about 1, from about 0.1 to about 1.5, from about 0.1 to about 1.0, from about 0.25 to about 1.5, from about 0.25 to about 1.0, from about 0.5 to 1.5, or from about 0.5 to 1.0.

The textured region of the glass cover member may have a low gloss. For example, the gloss may be less than about 20 gloss units, less than about 15 gloss units, from 5 gloss units to 20 gloss units, or from 10 gloss units to 20 gloss units as measured at 60 degrees.

The textured region of the glass cover member may produce a hazy effect. The transmissive haze may relate to the amount of light subject to wide angle scattering (e.g., greater than 2.5 degrees). Glass cover members with greater amounts of transmissive haze may have reduced transmissive contrast. The transmissive haze may be greater than or equal to about 50%, greater than or equal to about 60%, greater than or equal to about 70%, from about 60% to about 90%, or from about 70% to about 80%.

The textured region of the glass cover member need not have a high level of clarity. However, the clarity level may be sufficiently high so that images or graphics formed in the decorative coating are sufficiently clear and sharp and not overly blurred or otherwise distorted. The clarity may relate to the amount of light subject to transmissive narrow angle scattering (e.g., smaller than 2.5 degrees). Glass cover members with greater amounts of narrow angle scattering may have reduced clarity and sharpness. The clarity may be less than about 30%, less than about 20%, less than about 15%, less than about 10%, from about 5% to about 30%, from about 5% to about 20%, from about 5% to about 15%, or from about 5% to about 15%.

The textured region of the glass cover member and of the cover assembly may be configured to provide a particular coefficient of friction or otherwise may produce a particular tactile feel to a user when the textured region is touched. For example, the textured region may be configured to have a coefficient of friction, for a finger touching or sliding along the textured region, that is within a specified range, thereby providing a desired feel to the enclosure. A user may touch or slide a finger along the textured region, for example, as a result of normal handling of the electronic device.

The textured region of the glass cover member and of the cover assembly may also be configured so that dirt or debris accumulated from normal handling of the electronic device is readily cleanable or removable. As explained in more detail below, a readily cleanable texture may be configured so that the ratio of an average height of the peaks to the average spacing of the peaks is not overly large. The texture may also be configured so that a size of any recessed surface features is sufficiently large to facilitate cleaning, as discussed in greater detail with respect to FIG. 7. In addition, the texture may be configured so that the root mean square (RMS) slope of the surface features is not overly large. More detailed description of these and other texture parameters is provided with respect to FIG. 2 and, for brevity, will not be repeated here.

The discussion provided herein with respect to properties of textured glass cover members also relates more generally to textured glass components as described herein. These and other embodiments are discussed below with reference to FIGS. 1A-12. However, those skilled in the art will readily appreciate that the detailed description given herein with respect to these figures is for explanatory purposes only and should not be construed as limiting.

FIG. 1A shows a front view of an example electronic device 100 including a textured glass component, specifically a glass cover member. The electronic device 100 may be a mobile telephone (also referred to as a mobile phone). In additional embodiments, the electronic device 100 may be a notebook computing device (e.g., a notebook), a tablet computing device (e.g., a tablet), a portable media player, a wearable device, or another type of portable electronic device. The electronic device 100 may also be a desktop computer system, computer component, input device, appliance, or virtually any other type of electronic product or device component.

As shown in FIG. 1A, the electronic device 100 has an enclosure 110 including a cover assembly 122. The cover assembly 122 may at least partially define a front surface 102 of the electronic device 100. The cover assembly 122 is positioned over the display 144 and may define a transparent portion positioned over the display 144. The enclosure 110 may at least partially surround the display 144.

As shown in FIG. 1A, the enclosure 110 further includes a housing 112 (which may also be referred to as a housing member). The cover assembly 122 may be coupled to the housing 112. For example, the cover assembly 122 may be coupled to the housing 112 with an adhesive, a fastener, an engagement feature, or a combination thereof.

The housing 112 may at least partially define a side surface 106 of the electronic device 100 and may include one or more metal members or one or more glass members. As shown in FIG. 1A, the housing 112 is formed from a series of metal segments (114, 116) that are separated by polymer or dielectric segments 115 that provide electrical isolation between adjacent metal segments. One or more of the metal segments (114, 116) may be coupled to internal circuitry of the electronic device 100 and may function as an antenna for sending and receiving wireless communication.

The housing 112 may define one or more openings or through-holes. As shown in FIG. 1A, the metal segment 116 of the housing 112 defines an opening 117. The opening 117 may allow input or output from a device component such as a microphone or speaker or may contain a port. In some cases, the cover assembly 122 may also define an opening or through-hole.

Figure 1B:
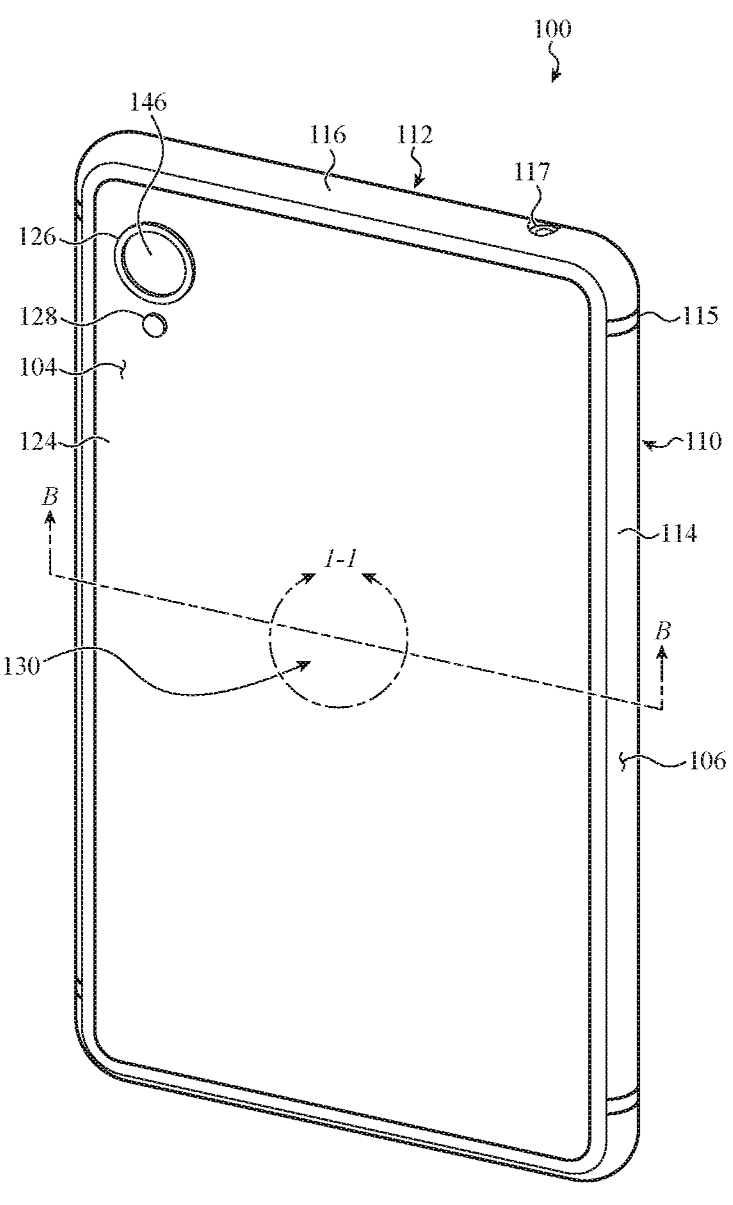
FIG. 1B shows a rear view of the electronic device of FIG. 1A.

FIG. 1B shows a rear view of the electronic device 100 of FIG. 1A. The enclosure 110 further includes a cover assembly 124. In the example of FIG. 1B, the cover assembly 124 defines a rear surface 104 of the electronic device 100.

The cover assembly 124 may include a textured region, such as textured region 130. A cover assembly including a textured region, such as the cover assembly 124, may also be referred to as a textured cover assembly. The textured region 130 may extend over a portion of the cover assembly 124 or may extend over the entire cover assembly 124.

As shown in FIG. 1B, the cover assembly 124 may define one or more openings or through-holes, such as openings 126 and 128. The opening 126 may be configured to surround a window 146 and one or more camera assemblies may be placed below the window. In some embodiments, the window 146 may function as a lens. The opening 128 may allow input to a microphone or other device component.

A cover assembly such as the cover assembly 122 or the cover assembly 124 typically includes a glass cover member. Examples of glass cover members are shown in FIGS. 2-3 and 5-10. In some embodiments a cover assembly may be described as a glass cover. More generally, a cover assembly may be formed from multiple layers. For example, a multilayer cover assembly may include one or more glass sheets, polymer sheets, and/or various coatings and layers. In some cases, a glass cover member may extend laterally across the cover assembly, such as substantially across the width and the length of the cover assembly. In additional cases, a cover assembly may include multiple cover glass members that together substantially extend laterally across the cover assembly.

Typical cover assemblies herein are thin, typically less than 5 mm in thickness, and more typically less than 3 mm in thickness. In some aspects, a glass cover member of a cover assembly can have a thickness from about 0.1 mm to 2 mm, from 0.5 mm to 2 mm, or from 0.2 mm to 1 mm. In some cases, the glass cover members may have a non-uniform thickness As shown in FIGS. 1A and 1B, the cover assembly 122 is a front cover assembly that defines a front surface of the electronic device and the cover assembly 124 is a rear cover assembly that defines a rear surface of the electronic device. The front cover assembly may comprise a front glass cover member and the rear cover assembly may comprise a rear glass cover member.

Figure 3:
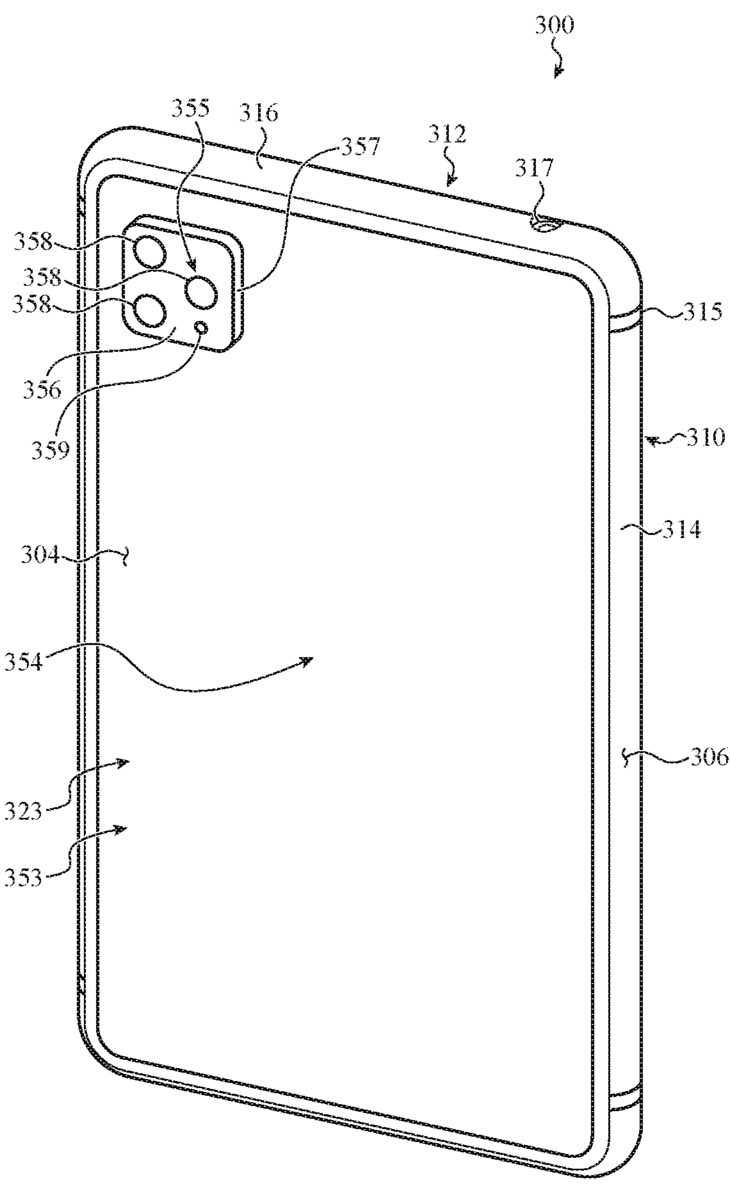
FIG. 3 shows an alternate rear view of another example of an electronic device.

Although the cover assemblies 122 and 124 are shown in FIGS. 1A and 1B as being substantially planar, the principles described herein also relate to cover assemblies and glass components including a surface protrusion (such as shown in FIG. 3), a surface recess, and/or one or more curved surfaces. In embodiments, a glass component such as a glass cover member may be three-dimensional. For example, the glass component may define a peripheral portion that is not coplanar with respect to a central portion. The peripheral portion may, for example, define a side wall of a device housing or enclosure, while the central portion defines a front surface (which may define a transparent window that overlies a display).

In additional embodiments, cover assemblies as described herein may be included in an all glass or a multi-faceted glass enclosure. In such embodiments, a cover assembly may define one or more surfaces of the enclosure, such as a front surface and a side surface, or a front surface, a side surface and a rear surface. A cover assembly for such an enclosure may include a glass component, a glass cover member, or a combination thereof.

The cover assembly 124 may be coupled to the housing 112 in a similar fashion as previously described for the cover assembly 122. FIG. 1B also shows the metal segments 114 and 116 and the polymer or dielectric segments 115 of the housing 112, as well as the opening 117 in the metal segment 116. Details of the metal segments 114 and 116, the polymer or dielectric segments 115, and the opening 117 were previously described with respect to FIG. 1A and, for brevity, will not be repeated here.

Figure 1C:
FIG. 1C shows a cross-section view of the electronic device of FIGS. 1A and 1B.
Figure 1C:
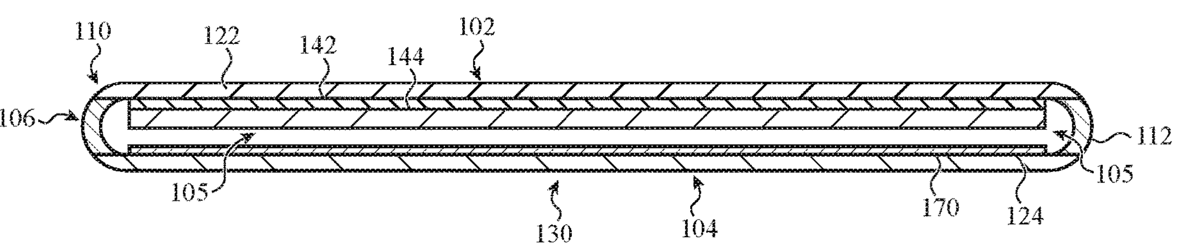

FIG. 1C shows a cross-section view of the electronic device 100 of FIGS. 1A and 1B. The cross-section may be taken along A-A of FIG. 1A. As previously described, the electronic device 100 includes the cover assembly 122 at the front and the cover assembly 124 at the rear of the electronic device 100. The cover assembly 122 may define a front surface 102 and the cover assembly 124 may define a rear surface 104 of the electronic device 100. The cover assemblies 122 and 124 are coupled to the housing 112.

As shown in FIG. 1C, the cover assembly 124 defines a textured region 130 of the electronic device 100. The textured region 130 may be configured to provide a desired appearance to an exterior surface of an electronic device. In addition, the texture may be configured to provide a particular "feel" to the electronic device, to be readily cleaned or both. In some cases, the textured region 130 has a roughness greater than that of a polished surface, such as a conventionally polished surface. For example, the textured region 130 may have at least one roughness parameter greater than that of a polished surface. Enlarged views of example surface textures in the textured region 130 are provided in FIGS. 2 and 5-9.

The cover assembly 124 further includes a decorative coating 170 disposed along an interior surface of the cover assembly. For example, the decorative layer may include a color layer (e.g., an ink, dye, paint, etc.) and/or a metal layer. In some embodiments, a multilayer decorative coating including at least one decorative layer is disposed at an interior surface of the cover assembly as described in further detail with respect to FIG. 2.

The electronic device 100 further includes a display 144 and a touch sensor 142 provided below the front cover assembly 122. Typically, the display 144 and the touch sensor 142 are coupled to the front cover assembly 122. The display 144 may be a liquid-crystal display (LCD), a light-emitting diode (LED) display, an LED-backlit LCD display, an organic light-emitting diode (OLED) display, an active layer organic light-emitting diode (AMOLED) display, and the like. The touch sensor 142 may be configured to detect or measure a location of a touch along the exterior surface of the front cover assembly 122.

Figure 12:
FIG. 12 shows a block diagram of a sample electronic device that can incorporate a textured glass component.
Figure 12:
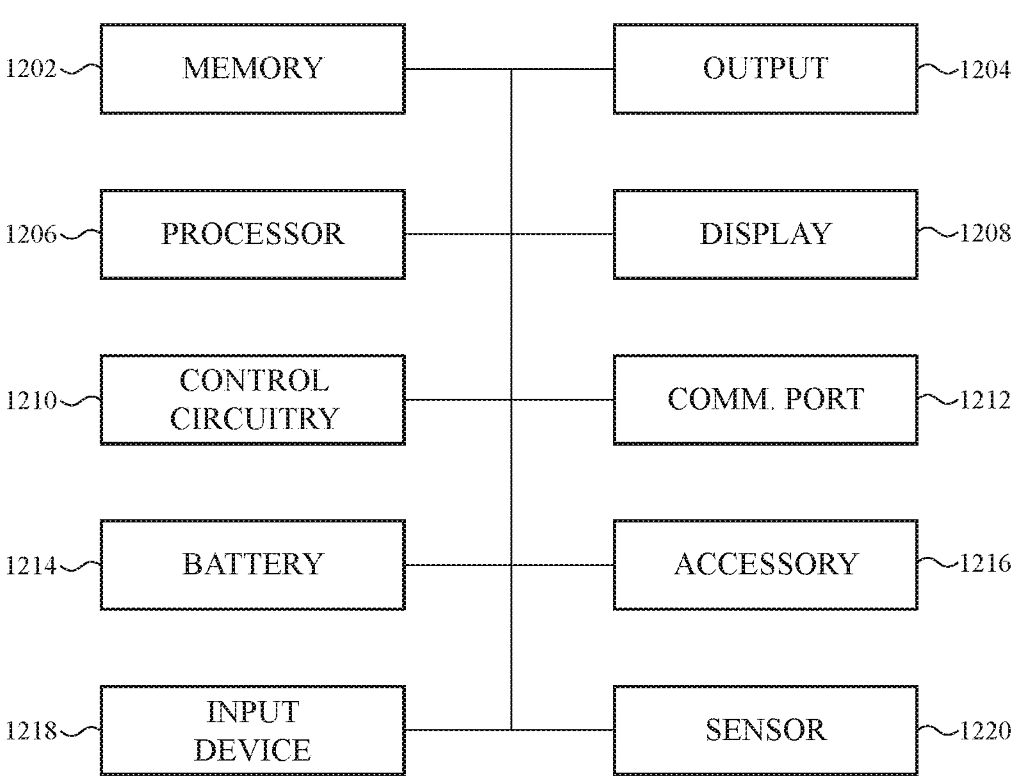

As previously described with respect to FIG. 1B, the electronic device 100 may include a camera assembly. Additional components may also be included within the interior volume 105 of the electronic device 100. These additional components may comprise one or more of a processing unit, control circuitry, memory, an input/output device, a power source, a charging assembly, a network communication interface, an accessory, and a sensor. Components of a sample electronic device are discussed in more detail below with respect to FIG. 12 and the description provided with respect to FIG. 12 is generally applicable herein.

Figure 2:
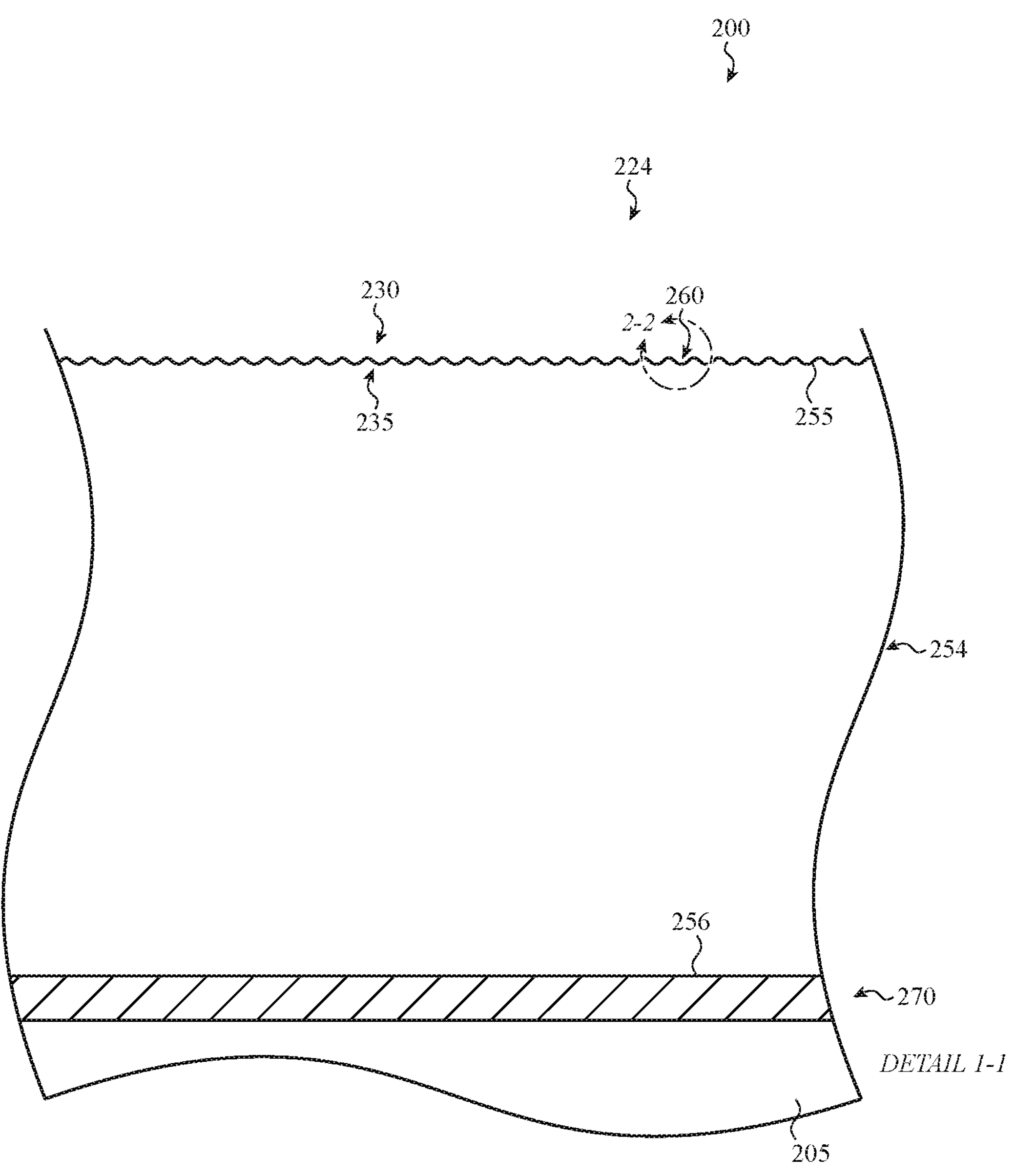
FIG. 2 shows a partial cross-section view of a cover assembly.

FIG. 2 shows a partial cross-section view of a cover assembly 224 of an electronic device 200. The cover assembly 224 may be an example of the cover assembly 124 of the electronic device 100 of FIG. 1B and the cross-section may be taken along B-B in detail area 1-1. FIG. 2 is enlarged with respect to FIG. 1C in order to show additional details of the textured region 230.

As shown in FIG. 2, the cover assembly 224 includes a glass cover member 254. The glass cover members described herein may comprise a glass material. The glass material may be a silica-based material. The glass material of the glass cover member may have a network structure, such as a silicate-based network structure. For example, the glass material may comprise an aluminosilicate glass or a boroaluminosilicate glass. As used herein, an aluminosilicate glass includes the elements aluminum, silicon, and oxygen, but may further include other elements. Similarly, a boroaluminosilicate glass includes the elements boron, aluminum, silicon, and oxygen, but may further include other elements. For example, an aluminosilicate glass or a boroaluminosilicate glass may further include monovalent or divalent ions which compensate charges due to replacement of silicon ions by aluminum ions. Suitable monovalent ions include, but are not limited to, alkali metal ions such as $Li^+$, $Na^+$, or $K^+$. An aluminosilicate glass including alkali metal ions may be referred to as an alkali aluminosilicate glass. Suitable divalent ions include alkaline earth ions such as $Ca^{2+}$ or $Mg^{2+}$. The glass material of the glass cover member may be ion exchangeable.

The glass cover member 254 defines a set of surface features 260 along an exterior surface 255 of the glass cover member 254. The exterior surface 255 may define a textured region 235 of the glass cover member 254 which includes the surface features 260. The textured region 230 of the cover assembly 224 may generally correspond to the textured region 235 of the glass cover member 254. The textured region 235 of the glass cover member 254 and any coatings applied to the surface features 260 together define the texture of the textured region 230 of the cover assembly 224.

The surface features 260 may define any of a range of shapes or configurations. For example, the surface features may define protrusions, recesses, or a combination thereof. In some embodiments, the surface features may be viewed as defining hills and valleys. The hills and valleys may be defined using areal texture analysis techniques as described in more detail below. A surface feature in the form of a recess or a valley may define a minimum point. Similarly, a surface feature in the form of a protrusion or a hill may define a maximum point, also referred to herein as a peak (for example, the point 563 of FIG. 5). In further embodiments, the surface features 260 may be described in terms of peaks and valleys.

More generally, the surface features 260 may have a variety of shapes, such as rounded or angular features. As examples, the surface features 260 may define a circular, oval, polygonal, rectangular, or irregular surface contour. Furthermore, the surface features 260 may define protrusions or recesses and may have any suitable shape and may be pyramidal, conical, cylindrical, arched, have a curved upper surface or a frustum of a shape such as a cone, and so on.

The surface features 260 may be configured to provide particular optical properties to the glass cover member 254, the cover assembly 224, and the electronic device 200. However, the surface features 260 defining the texture may not be individually visually perceptible. In some cases, the texture may be configured to provide particular levels of such optical properties such as transmissive haze, clarity, gloss, graininess, and combinations thereof.

The graininess of the textured region 230 of the cover assembly 224 or the corresponding textured region 235 of the glass cover member 254 may be measured under diffused illumination using commercially available equipment. In some cases, an image of the textured surface of the glass cover member 254 may be obtained using a digital camera and the lightness of each pixel of the image may be determined, thereby allowing determination of the lightness variation across the textured surface. For example, the BYK-mac device available from BYK may produce a graininess value determined from a histogram of the lightness levels. The graininess of the textured surface may be less than about 1.5 or less than about 1.0. In addition, the graininess may be from about 0.1 to about 1.5, from about 0.1 to about 1.0, from about 0.25 to about 1.5, from about 0.25 to about 1.0, from about 0.5 to about 1.5, or from about 0.5 to about 1.0. These graininess values may be measured prior to application of any decorative coating to the glass cover member, in which case the graininess of the textured region 235 of the glass cover member 254 may be measured.

The transmissive haze of the textured region 230 of the cover assembly 224 or the corresponding textured region 235 of the glass cover member 254 may be measured using commercially available equipment and according to ASTM or ISO standard test methods. The transmissive haze may relate to the amount of light subject to wide angle scattering (e.g., greater than 2.5 degrees). The transmissive haze may be greater than or equal to about 50%, greater than or equal to about 60%, or greater than or equal to about 70%. For example, the transmissive haze may be from about 60% to about 90%, or from about 70% to about 80%. As non-limiting examples, the transmissive haze may be measured using a haze-gard i device available from BYK or a GC 5000L variable photometer available from Nippon Denshoku. The transmissive haze may be measured for the cover assembly or glass cover member as removed from the electronic device. In addition, the transmissive haze may be measured prior to the application of any decorative coating to the glass cover member, in which case the transmissive haze of the textured region 235 of the glass cover member 254 may be measured.

The clarity or the transmissive narrow angle scattering of the textured region 230 of the cover assembly 224 or the corresponding textured region 235 of the glass cover member 254 may be measured using commercially available equipment and according to ASTM or ISO standard test methods. The clarity may be less than about 30%, less than about 20%, less than about 15%, or less than about 10%. For example, the clarity may be from about 5% to about 30%, from about 5% to about 20%, from about 5% to about 15%, or from about 5% to about 15%. The transmissive narrow angle scattering may be measured using a haze-gard i device available from BYK or a GC 5000L variable photometer available from Nippon Denshoku. A clarity value may be determined from measurements of the intensity in a central region ($I_{central}$) and an intensity in a ring around the central region ($I_{ring}$). For example, the clarity value may be equal to $100\%*(I_{central}-I_{ring})/(I_{central}+I_{ring})$. The clarity or the transmissive narrow angle scattering may be measured for the cover assembly or glass cover member as removed from the electronic device. In some cases, the clarity may be measured prior to the application of any decorative coating to the glass cover member and the clarity of the textured region 235 of the glass cover member 254 may be measured.

The textured region 230 of the cover assembly 224 or the corresponding textured region 235 of the glass cover member 254 may be configured to provide a low gloss appearance to the surface. In some embodiments, the textured region 235 of the glass cover member 254, prior to application of the decorative coating 270, may have a gloss value of less than about 20 gloss units, less than about 15 gloss units, from about 5 gloss units to about 20 gloss units, or from about 10 gloss units to about 20 gloss units as measured at 60 degrees. In some cases, the gloss of the textured region may be measured using commercially available equipment and according to ASTM or ISO standard test methods. The angle measurement may refer to the angle between the incident light and the perpendicular to the textured region of the surface.

Surface texture parameters include areal surface texture parameters such as amplitude parameters, spatial parameters, and hybrid parameters. Surface filtering may be used to exclude surface noise and/or surface waviness before determining the surface texture parameters. In addition, a segmentation technique may be used to determine feature parameters such as the maximum diameter, the minimum diameter, the area, and the perimeter. These parameters may be calculated on the basis of the feature shape as projected onto the reference surface (e.g., a reference plane). Mean values may be determined for a given class of surface features (e.g., hills or valleys). Surface texture parameters and methods for determining these parameters (including filtering and segmentation) are described in more detail in International Organization for Standardization (ISO) standard 25178 (Geometric Product Specifications (GPS)—Surface texture: Areal). These surface texture parameters may be measured using commercially available equipment.

For example, the surface features 260 of the glass cover member 254 may be characterized, in part, by the heights of the surface features. The height may be measured with respect to a reference surface, such as the arithmetical mean of the surface. The heights of the surface features 260 may not be uniform, so that the surface features have a distribution of heights. The magnitude of the heights of the surface features 260 may fall in the range from zero to about 5 microns, zero to about 2.5 microns, from zero to about 2 microns, from zero to about 1.5 microns, or from zero to about 1 micron. The surface features 260 may be characterized by the root mean square height Sq or the arithmetic mean height Sa of the surface. In some cases, a textured region may be referred to as being rougher than another region of the glass cover member or cover assembly when it has a greater RMS height. The root mean square (RMS) height of the surface features 260 may be greater than zero and less than about 2.5 microns, greater than zero and less than about 2 microns, greater than zero and less than about 1.5 microns, greater than zero and less than about 1 micron, from about 0.1 microns to about 2 microns, from about 0.1 microns to about 1.5 microns, from about 0.1 microns to about 1.25 microns, from about 0.1 microns to about 1.0 micron, from about 0.25 microns to about 2 microns, from about 0.25 microns to about 1.5 microns, from about 0.25 microns to about 1.25 microns, from about 0.25 microns to about 1.0 micron, from about 0.5 microns to about 2 microns, from about 0.5 microns to about 1.5 microns, from about 0.5 microns to about 1.25 microns, or from about 0.5 microns to about 1.0 micron. For comparison, the root mean square height of a polished surface in some cases may be from about 1 nm to about 125 nm, from about 1 nm to about 100 nm, from about 1 nm to about 75 nm, from about 1 nm to about 50 nm, from about 1 nm to about 25 nm, or from about 1 nm to about 10 nm.

In addition, the surface features 260 may be characterized by lateral parameters, such as the distance between peaks.

The spacing between peaks may not be uniform, so that there is a distribution of spacings between peaks. The average (mean) distance or spacing between peaks may be referred to as the average pitch or mean pitch. The average pitch may be from about 1 micron to about 20 microns, from about 1 micron to about 15 microns, from about 1 micron to about 10 microns, from about 2.5 microns to about 20 microns, from about 2.5 microns to about 15 microns, from about 2.5 microns to about 10 microns, from about 5 microns to about 20 microns, from about 5 microns to about 15 microns, or from about 5 microns to about 10 microns.

In some embodiments, the surface features 260 may be configured so to have a particular ratio of the average height of the peaks to the average spacing of the peaks. For example, the ratio of the RMS height to the mean pitch may be from about 0.01 to about 0.6, from about 0.01 to about 0.3, from about 0.02 to about 0.6, from about 0.02 to about 0.3, from about 0.03 to about 0.6, from about 0.03 to about 0.3, from about 0.04 to about 0.6, or from about 0.04 to about 0.3.

The surface features 260 may also be characterized by a lateral size. For example, the surface features 260 may be characterized by a maximum lateral (or linear) size and a minimum lateral (or linear size). The surface features 260 may have a maximum lateral size small enough that they are not visually perceptible as individual features. In addition, the lateral size and spacing of the surface features 260 may be configured so that the glass cover member has a sufficiently low level of graininess.

The surface features 260 may be characterized by the root mean square slope (Sdq), also referred to as the root mean square gradient. In some embodiments, the root mean square slope may be greater than zero and less than about 1.25, greater than zero and less than about 1, from about 0.1 to less than about 1, from about 0.25 to less than about 1, from about 0.25 to about 0.75, or from about 0.1 to about 0.5.

The surface features 260 may also be characterized by the curvature of the peaks (also referred to as summits), such as by the arithmetic mean summit curvature $S_{sc}$. In some embodiments, the arithmetic mean summit curvature is greater than zero and less than about 2.0 microns, greater than zero and less than or equal to about 1.5 microns$^{-1}$, from about 0.1 microns$^{-1}$ to about 2.0 microns$^{-1}$, from about 0.1 microns$^{-1}$ to about 1.5 microns$^{-1}$, from about 0.25 microns$^{-1}$ to about 2.0 microns$^{-1}$, from about 0.25 microns$^{-1}$ to about 1.5 microns$^{-1}$, from about 0.5 microns$^{-1}$ to about 2.0 microns$^{-1}$, from about 0.5 microns$^{-1}$ to about 1.5 microns$^{-1}$ from about 0.75 microns$^{-1}$ to about 2.0 microns$^{-1}$, or from about 0.75 microns to about 1.5 microns$^{-1}$.

As shown in FIG. 2, a cosmetic or decorative coating 270 may be disposed along an interior surface 256 of the glass cover member 254. In some cases, the decorative coating 270 may directly contact the interior surface 256. The interior cavity 205 of the electronic device 200 is inward of the decorative coating 270. As previously discussed, the surface features 260 of the glass cover member 254 may be configured to minimize less desirable visual effects when the decorative coating is viewed through the textured region 230 of the cover assembly 224. For example, it may be preferred that the texture does not produce an undesirable amount of visual contrast variation and/or a visual texture.

In some cases, the decorative coating 270 comprises a polymer. The decorative coating 270 may comprise at least 40%, 50%, 60%, or 70% of the polymer and may therefore be referred to as a polymer-based coating or a polymeric coating. When the coating 270 further comprises a colorant, the polymer may act as a binder for the colorant. The colorant (e.g., a pigment) may be substantially dispersed in a matrix of the polymer. In some cases, the decorative coating 270 may function as a masking layer. As examples, the polymer may be polyester-based, epoxy-based, urethane-based, or based on another suitable type of polymer or copolymer. The decorative coating 270 may further comprise optional additives such as one or more extenders, diluents, polymerization initiators, and/or stabilizers. In some embodiments, the polymer has a cross-linked structure.

The decorative coating 270 of FIG. 2 may include at least one color layer. The color layer may comprise a polymer and a colorant dispersed in the polymer and may be transparent, translucent, or opaque. More generally, any pigment, paint, ink, dye, sheet, film, or other layer may be used as the decorative coating 270 or a portion thereof. In some embodiments, the decorative coating 270 is a multilayer coating that includes a first color layer and a second color layer. Each of the color layers may be transparent, translucent, or opaque. Each of the color layers may include the same colorant or different color layers may include different colorants. The thickness of each of the color layers in the decorative coating 270 may be from about 2 microns to about 10 microns.

The color layer(s) and the decorative coating 270 may have a chromatic color or an achromatic color. The color of the decorative coating 270 may be characterized using a color model. For example, in the hue-saturation-value (HSV) color model, the hue relates to the wavelength(s) of visible light observed when the color feature is viewed (e.g., blue or magenta) and the value relates to the lightness or darkness of a color. The saturation relates to the perceived colorfulness as judged in proportion to its brightness. As another example, coordinates in CIEL*a*b* (CIELAB) color space may be used to characterize the color, wherein L* represents brightness, a* the position between red/magenta and green, and b* the position between yellow and blue.

In some cases, the decorative coating 270 as viewed through the textured surface region 230 may have a uniform appearance. For example, the decorative coating 270 may appear uniform to the unaided eye (also referred to as being visually uniform). The decorative coating 270 may have a color variation less than a specified value. For example, an image of the coating as viewed through the glass cover member may be obtained using a digital camera and the color of each pixel of the image may be determined, thereby allowing determination of the color and/or lightness variation. The color uniformity over the textured region may be assessed by assessing the uniformity of the color values obtained using a given color model. For example, the variation in L*, a*, b*, or a combination thereof may be less than about 20%, 15%, 10%, or 5% as measured through the textured region 230.

In some cases a reference value of the color uniformity may be measured for the decorative coating 270 and a perceived color uniformity value of the decorative coating 270 as viewed through the textured region 230 may be compared to the reference value. For example, the reference value of the color uniformity may be a first color uniformity value and the perceived color uniformity value of the decorative coating 270 as viewed through the textured region 230 may be a second color uniformity value. In some cases, the second color uniformity value may be the same or substantially the same as the first color uniformity value. For example, the difference between the second color uniformity value and the first color uniformity value may be visually imperceptible. In additional examples, the variation between the second color uniformity value and the first color uniformity value may be less than about 20%, 15%, 10%, or 5%. As previously discussed, a color uniformity value may be determined from the variation in L*, a*, b*, or a combination thereof or by other color measurement techniques.

For example, a reference value of the color uniformity may be obtained for the decorative coating 270 as applied to a glass cover member which lacks a textured surface as described herein. Instead, the glass cover member used to obtain the reference value may have an as-manufactured surface or a polished surface. The as-manufactured surface or polished surface may have an RMS surface height less than that of a textured surface as described herein.

Decorative coating 270 may further include additional layers such as an additional color layer, a metal layer, an optically clear layer, an optically dense layer, and combinations thereof. When the cover assembly 224 includes one or more additional layers, these layers may be disposed along an interior surface of the glass cover member, between the glass cover member and another layer.

In some cases, the decorative coating need not include a color layer, but may include one or more of an optically dense layer and a metal layer. These additional layers may be as described for decorative coating 570 of FIG. 5 and, for brevity, that description will not be repeated here.

FIG. 3 shows a rear view of another example of an electronic device 300. The electronic device 300 of FIG. 3 may be similar in some respects to the electronic device 100 of FIGS. 1A and 1B and description of shared or similar features is omitted to reduce redundancy. The front view of electronic device 300 may be similar to that of electronic device 100 as shown in FIG. 1A as the devices may share similar features as viewed from the front. Also, the cross-sectional view of electronic device 300 may be similar to that of electronic device 100 as shown in FIG. 1C as the devices may share similar components and internal configurations.

As shown in FIG. 3, the enclosure 310 includes a cover assembly 323 which defines a rear surface 304 of the electronic device. In this example, the cover assembly 323 defines a substantial entirety of the rear surface 304 of the electronic device and includes a glass cover member 353. The glass cover member 353 may also extend across a substantial entirety of the rear surface 304 of the electronic device. The glass cover member 353 and the cover assembly 323 may be examples of glass cover member 254 and cover assembly 224 previously described with respect to FIG. 2. Details of these glass cover members and cover assemblies are applicable to the glass cover member 353 and the cover assembly 323 and, for brevity, will not be repeated here. In some cases, the cover assembly 323 may further include a smudge-resistant coating, a decorative coating, or a combination thereof (as shown, for example, in FIG. 8).

As shown in FIG. 3, the glass cover member 353 defines a base portion 354. The glass cover member 353 further defines a protruding portion (also referred to as a protrusion) 355 which extends outward from the base portion 354. The protruding portion 355 defines a region 356 which protrudes and is raised or offset with respect to the base portion 354. Therefore, the region 356 may be referred to as a protruding region, an offset portion, or as a raised region. As an example, the raised region 356 may define a plateau. The protrusion 355 may also define a side region 357, which may extend from the base portion 354 to the raised region 356. In an embodiment, the amount of protrusion or offset is from 0.5 mm to 1.5 mm.

In some cases, at least a portion of a camera assembly is positioned below the protruding portion 355. The size of the protruding portion 355 may depend at least in part on the size of the camera assembly. In some embodiments, a lateral dimension (e.g., a width) of the protruding portion 355 may be from 5 mm to 30 mm or from 10 mm to 20 mm. In some cases, the protruding portion 355 may protrude with respect to the base portion 354 due to a greater thickness of the glass cover member 353 in the protruding portion. In some cases, the protruding portion 355 has a thickness greater than about 1 mm and less than or equal to about 2 mm and the base portion 354 has a thickness greater than about 0.5 mm and less than about 1 mm. As examples, the ratio of the thickness of the protruding portion to the thickness of the base portion may be from about 1.25 to about 3 or from about 1.5 to about 2.

The raised region 356 of the glass cover member 353 may further define one or more window regions 358. In some cases, a window region 358 may be positioned over a device component such as a camera, a light source, or the like and the window region 358 is configured to allow passage of light to or from the underlying device component. In additional cases, the window region 358 may comprise an opening in the raised region 356 and the device component may be positioned at least partially within the opening. The window region 358 may be substantially coplanar with, recessed, or protruding with respect to a surrounding region of the raised region 356. The example of FIG. 3 shows three window regions 358, but more generally a raised region of a cover assembly may define any number of window regions, such as one, two, three, four, or five window regions.

The raised region 356 of the glass cover assembly 353 may further define an opening 359. Opening 359 may allow input or output to another device component, such as a microphone or other device component. Opening 359 may be small relative to the size of the window region 358.

In some cases, the glass cover member 353 may be of unitary construction. For example, the glass cover member 353 may be formed from a single piece of a glass material to define a monolithic glass component. The protrusion 355 may be formed into the glass cover member 353 by a molding or a slumping process to define the protruding profile shape. The protrusion 355 may also be formed into the glass cover member 353 by machining away material around the portion of the glass cover member 353 that is to become the protrusion 355. In addition, openings may be drilled in the protrusion 355 as desired. In some cases, the exterior surface of the glass cover member 353 formed by an initial shaping process may be ground, polished, or otherwise processed to achieve the desired surface finish(es). In additional cases, a cover assembly may include multiple glass cover members, each defining a different portion or region of the cover assembly.

In some embodiments, at least one of the base portion 354, the raised region 356, or the side region 357 of the glass cover member 353 includes a textured region. In some cases, the glass cover member 353 defines multiple textured regions, each textured region being defined along one or more of the base portion 354, the raised region 356, or the side region 357. The description of the textured region 230, described above with respect to FIG. 2, may apply to any of the various textured regions described herein with respect to FIG. 3. Different methods for forming textures on the glass cover member 353 are discussed with respect to FIG. 11 and those details are applicable here.

In general, each of the various textured regions of the glass cover member 353 may have similar textures to each other or may have different textures from each other. Different textures may result from using different process conditions in a single type of texturing process or may result from using different types of texturing processes. In some embodiments, a textured region of the glass cover member 353 may have a texture formed by overlap of two different textures. Such a texture may result from using two different texturing processes to create the texture region.

In one example, the base portion 354 and the raised region 356 of the glass cover member 353 may both define respective textured regions. In some cases, the side region 357 may also define a textured region. Each of the textured regions of the base portion 354, the side region 357, and the raised region 356 may have substantially similar textures to each other or may have differing textures from each other. For example, a textured region of the base portion 354 may have a roughness greater than that of a polished surface while a textured region of the raised region 356 may have a roughness lower than that of the base portion 354. In some cases, the roughness of the textured region of the raised region 356 may be similar to that of a polished surface. The roughness may be evaluated on the basis of at least one roughness parameter, such as a root mean square surface height, a root mean square slope, and/or a mean peak curvature.

In some cases, the textured region of the raised region 356 may be configured to produce a similar visual effect to the textured region of the base portion 354. The side region 357 may also define a textured region configured to produce a similar effect to the textured regions of the raised region 356 and the base portion 354 in order to provide visual continuity between the base portion 354, the side region 357, and the raised region 356. For example, the textured regions of the base portion 354, the side region 357, and the raised region 356 may be configured to produce a hazy effect and may have a relatively high value of transmissive haze.

A textured region of the raised region 356 may define a substantial entirety of the raised region 356. Alternately, a window region 358 may have a different texture than another region of the raised region 356. For example, the texture of the other region of the raised region 356 may be configured to produce a hazy effect and texture of the window region 358 may be configured to produce a less hazy effect and to have greater clarity.

In some cases, each of the base portion 354 and the side region 357 may define a textured region. The raised region 356 may not include a textured region or may have a smooth texture that is tactilely and/or visually distinct from the textures of the base portion 354 and the side region 357. For example, the raised region 356 may have a relatively smooth texture resulting from a machining, polishing, or glass forming process. The textured region of the base portion 354 and the textured region of the side region 357, respectively, may have substantially similar textures to each other or may have differing textures from each other. In some cases, the textured region of the base portion 354 may be configured to produce a similar visual effect to the textured region of the side region 357 in order to provide visual continuity between the base portion 354 and the side region 357. For example, the textured regions of each of the base portion 354 and the side region 357 may both be configured to produce a hazy effect and may have a relatively high value of transmissive haze.

In an additional example, the raised region 356 may define a textured region while the base portion 354 may not include a textured region or may have a smooth texture that is tactilely and/or visually distinct. In some cases, the side region 357 may also define a textured region. The textured region of the raised region 356 and the textured region of the side region 357, respectively, may have substantially similar textures to each other or may have differing textures from each other. In other cases, the side region 357 may not include a textured region or may have a smooth texture that is tactilely and/or visually distinct.

As shown in FIG. 3, the housing 312 is formed from a series of metal segments (314, 316) that are separated by polymer or dielectric segments 315 that provide electrical isolation between adjacent metal segments. The metal segment 316 of the housing 312 defines an opening 317. The housing 312 may at least partially define a side surface 306 of the electronic device 300.

Figure 4A:
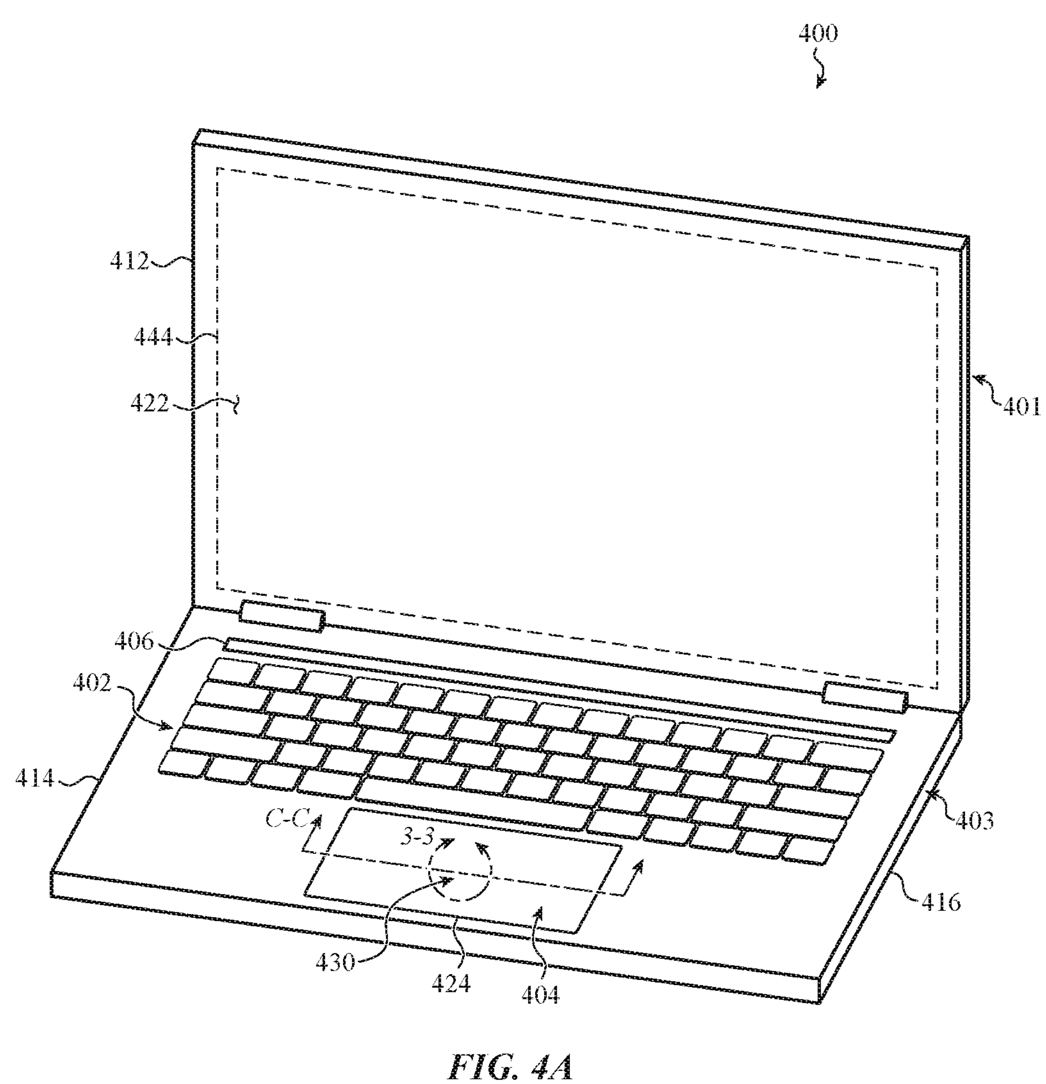
FIG. 4A shows another example of an electronic device including a textured glass component.

FIG. 4A shows another example of an electronic device including a textured glass cover member. The electronic device 400 may be a laptop computer. As shown in FIG. 4A, the electronic device 400 has a display portion 401 and a base portion 403 pivotally coupled to the display portion 401. The display portion 401 includes a display housing 412 and a display 444 at least partially within the display housing 412. A cover assembly 422 is provided over the display 444.

The base portion 403 is configured to receive various types of user inputs, such as touch inputs, force inputs, and combinations of touch and force inputs. As shown in FIG. 4A, the base portion 403 includes a top case 414 which defines a keyboard region 402 and touch input regions 404 and 406. As shown in FIG. 4A, the touch input region 404 includes a cover assembly 424 defining a textured region 430. The cover assembly 424 may provide a trackpad for the electronic device 400. In some embodiments, a single touch input region (e.g., the touch input region 404) may include differently textured surfaces in different regions of the element. Further different touch input regions (e.g., the touch input regions 404 and 406) may include differently textured surfaces. As discussed in more detail with respect to FIG. 4B, the electronic device 400 may comprise a touch sensor configured to detect a touch or touch input along touch input region 404.

The top case 414 may be coupled to a bottom case 416 and the top case 414 and the bottom case 416 may together define a portion of an interior volume of the base portion 403. The display housing 412, top case 414, and bottom case 416 may each be formed of metal, plastic, glass, or combinations thereof.

Figure 4B:
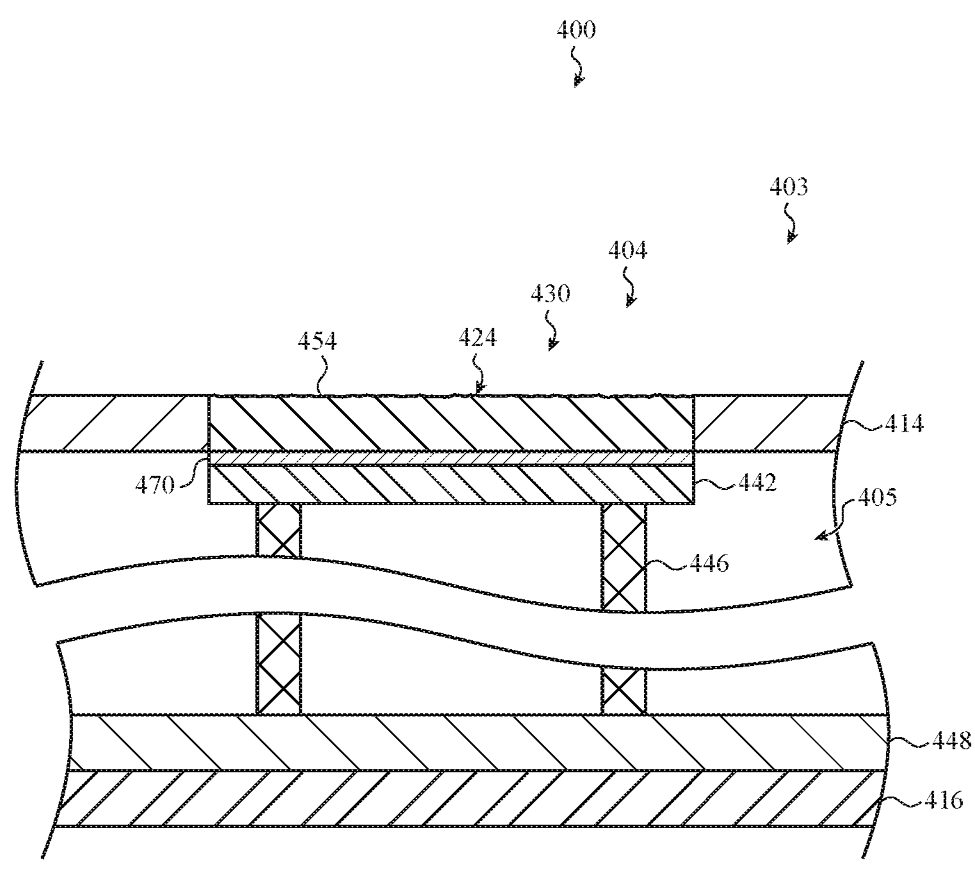
FIG. 4B shows a schematic partial cross-section view of the electronic device of FIG. 4A.

FIG. 4B shows a schematic partial cross-section view of a base portion 403 of the electronic device 400. The cross-section may be taken along C-C in detail area 3-3 of FIG. 4A. As shown in FIG. 4B, the touch input region 404 includes a cover assembly 424 which defines a textured region 430 of the electronic device 400. The cover assembly 424 is coupled to the top case 414. The bottom case 416 is also shown.

The cover assembly 424 includes a glass cover member 454. A decorative coating 470 is provided along an interior surface of the glass cover member 454. The decorative coating 470 may comprise at least one color layer. The color layer of the decorative coating 470 may be similar to the color layers of the decorative coating 270 and any other decorative coatings described herein. Details of these decorative coatings are applicable to the decorative coating 470 and, for brevity, will not be repeated here.

As schematically shown in FIG. 4B, a touch sensor 442 is provided along the decorative coating 470 and a force sensor 446 is provided below the touch sensor 442. The force sensor 446 is configured to detect deformation and may be a strain gauge-based force sensor, a capacitive-based force sensor, or the like. One or more additional components, schematically indicated by element 448, may also be included within the interior volume 405 of the base portion 403. These additional components may comprise one or more of a processing unit, control circuitry, memory, an input/output device, a power source, a network communication interface, an accessory, and a sensor. Components of a sample electronic device are discussed in more detail below with respect to FIG. 12.

Figure 5:
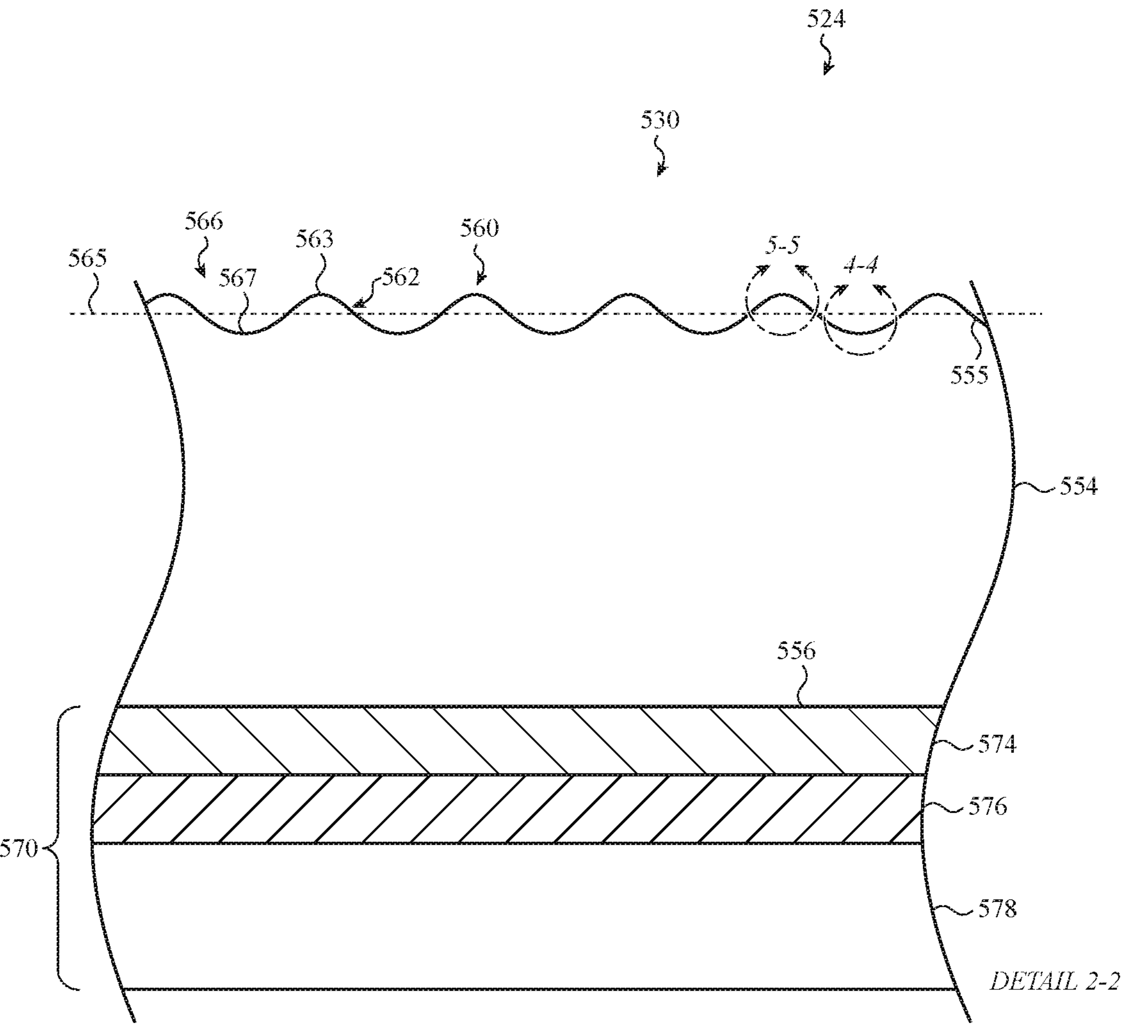
FIG. 5 shows an enlarged partial cross-section view of a cover assembly.

FIG. 5 shows an enlarged partial cross-section view of a cover assembly 524 including a glass cover member 554. The view of FIG. 5 may be an example of detail area 2-2 from FIG. 2. As schematically shown in FIG. 5, the textured region 530 of the cover assembly 524 includes surface features 560, such as the surface features 562 and 566. The exterior surface 555 of the glass cover member 554 defines the surface features 560.

As shown in FIG. 5, the surface features 560 may define one or more recesses, such as the surface feature 566. Surface feature 566 may define a minimum point 567. The surface features 560 may also define one or more protrusions, such as the feature 562. Surface feature 562 may define a maximum point 563. As schematically shown in FIG. 5, the surface features 560 may define a set of minimum points as well as a set of maximum points. The set of maximum points may also be referred to as a set of peaks. The surface features 560 may define a set of recesses, each recess being positioned between adjacent peaks of the set of peaks.

In some embodiments, the surface features 560 define a set of hills and valleys. The hills and valleys may be defined using areal texture analysis techniques as previously described. The surface feature 562 may generally correspond to a hill feature and the surface feature 566 may generally correspond to a valley feature. In some embodiments, a set of hills and valleys has a substantially uniform spacing between hill features, valley features, or a combination thereof. In additional embodiments, a set of valleys may have a non-uniform or an irregular spacing between hill features and/or valley features as described in greater detail with respect to FIG. 9.

The heights of the surface features 560 may be measured with respect to a reference surface 565. For example, the heights of the hills may be determined from the maximum points (e.g., the point 563) and the heights of the valleys may be determined from the minimum points (e.g., the point 567). The glass cover member 554 and the cover assembly 524 may be an example of the glass cover member 254 and the cover assembly 224 of FIG. 2 or any other glass cover members and cover assemblies described herein. Details of these glass cover members and cover assemblies are applicable to the glass cover member 554 and the cover assembly 524 and, for brevity, will not be repeated here.

As shown in FIG. 5, a decorative coating 570 may be disposed along the interior surface 556 of the glass cover member 554. The decorative coating 570 may be similar to any of the decorative coatings previously described with respect to FIG. 2. In the example of FIG. 5, the decorative coating 570 includes a first color layer 574 and a second color layer 576. Each of the color layers, such as color layers 574 and 576, may be transparent, translucent, or opaque. The color layer may comprise a polymer and a colorant dispersed in the polymer. More generally, any pigment, paint, ink, dye, sheet, film, or other layer may be used as the decorative coating 570 or a portion thereof. Each of the color layers may include the same colorant or different color layers may include different colorants. The thickness of each of the color layers in the decorative coating 570 may be from about 2 microns to about 10 microns.

As shown in FIG. 5, the decorative coating 570 may also include an optically dense layer 578. The optically dense layer 578 may substantially reduce or prevent transmission of visible light, thereby "blocking" the view through the cover assembly 524 of components positioned behind the optically dense layer 578. In addition, the optical properties of the optically dense layer 578 may be configured to adjust the lightness and/or the chroma of the decorative coating 570.

For example, the optical density of the optically dense layer 578 may be described by $OD=\log_{10}$ (initial intensity/transmitted intensity) and may be greater than or equal to 1, greater than or equal to 2, or greater than or equal to 3. Generally, the optically dense layer 578 comprises a polymer. The optically dense layer 578 may further comprise one or more pigments, dyes, or a combination thereof. As an example, the optically dense layer 578 has a substantially wavelength independent (neutral) reflectance and/or absorption spectrum over the visible range. In addition, the optically dense layer 578 may have an achromatic characteristic color. The thickness of the optically dense layer 578 may be from about 2 microns to about 10 microns.

In further embodiments, the decorative coating 570 may comprise a metal layer in addition to one or more color layers. Such a metal layer may give a metallic effect to the decorative coating as seen through the glass cover member 554. When used to form a metallic marking, the metal layer may be a partial layer (e.g., having a smaller lateral dimension than a color layer). For example, the metal of the layer may be selected from aluminum, copper, nickel, silver, gold, platinum, and alloys thereof. In some cases, the metal layer may be configured to at least partially transmit visible light. For example, the metal layer may have a thickness greater than about 0.5 nm and less than 10 nm, less than 5 nm, less than 3 nm, less than 2 nm, or less than 1 nm. Thicker metal layers may be used for forming an indicium or another marking under the glass cover member 554. The marking may be in the form of an image, a pattern, text, a glyph, a symbol, an indicia, a geometric shape, or a combination thereof.

The metal layer may be disposed along an interior surface of the glass cover member. In some cases the metal layer may be used in combination with an optically clear layer. The optically clear layer may have one or more mechanical properties (e.g., modulus, hardness and/or toughness) which limit or prevent propagation of cracks from the metal layer into the glass cover member 554. The optically clear layer may be a polymeric layer and may have a thickness from about 1 micron to about 5 microns. The optically clear layer may be disposed along the interior surface 556 of the glass cover member 554, the metal layer may be positioned between the optically clear layer and the optically dense layer 578, a first color layer may be positioned between the metal layer and the optically dense layer 578, and a second color layer may be positioned between the first color layer and the optically dense layer 578.

In addition, the decorative coating may comprise additional polymeric layers behind (e.g., inward of) and disposed along the optically dense layer. If components of the electronic device are glued to the decorative coating, these additional layers may include a protective layer which protects the color layers of the multilayer coating from damage due to the glue. The additional layers may further include a layer inwards of the protective layer which facilitates adhesion of the decorative coating to the glue.

Figure 6:
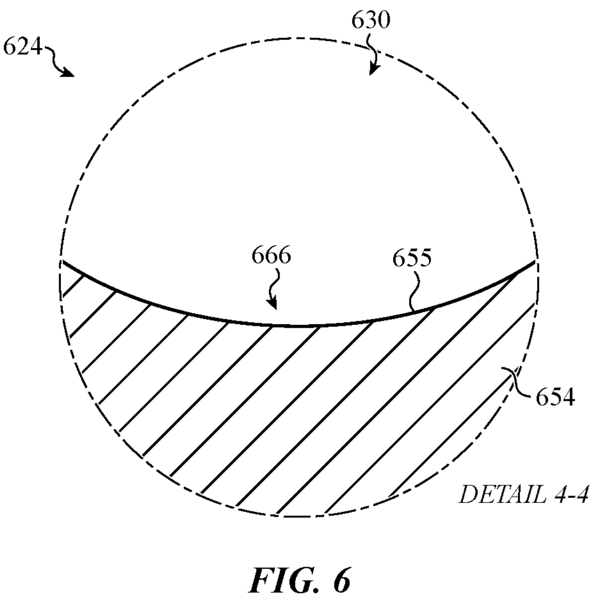
FIG. 6 shows a detail view of an example textured region.

FIG. 6 shows a detail view of an example of a textured region 630 of a cover assembly 624. For example, FIG. 6 may show an example of the detail region 4-4 of FIG. 5. The scale of FIG. 6 is exaggerated as compared to FIG. 5 in order to better illustrate details of the textured region 630.

The textured region 630 includes a surface feature 666 of the glass cover member 654. The surface feature 666 generally has the form of a recess. At the scale shown in FIG. 6, the external surface 655 of the glass cover member 654 appears generally smooth within the recess defined by surface feature 666. Therefore, the root mean square slope of the textured region of the glass cover member 654 may be largely determined by surface features on the scale of surface feature 666.

The textured region 630, the cover assembly 624, and the glass cover member 654 may be an example of the textured region 230, the cover assembly 224, and the glass cover member 254 of FIG. 2 or any other textured regions, cover assemblies, and glass cover members described herein. Details of these textured regions, cover assemblies, and glass cover members are applicable to the textured region 630, the cover assembly 624, and the glass cover member 654 and, for brevity, will not be repeated here.

Figure 7:
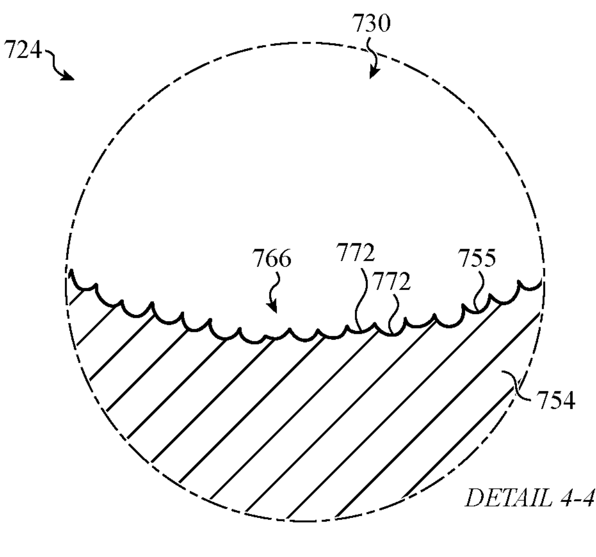
FIG. 7 shows a detail view of another example textured region.

FIG. 7 shows a detail view of another example of a textured region 730 of a cover assembly 724. For example, FIG. 7 may show another example of the detail region 4-4 of FIG. 5. The scale of FIG. 7 is exaggerated as compared to FIG. 5 in order to better illustrate details of the textured region 730. The textured region 730 includes a surface feature 766 of the glass cover member 754. Surface feature 766 generally has the form of a recess. In contrast to FIG. 6, the external surface 755 within surface feature 766 appears rougher than the external surface 655 within surface feature 666. For example, the surface feature 766 may include smaller features 772 which are also in the form of recesses. It should be appreciated that the shapes of the smaller sized features 772 are not limited to those shown in FIG. 7.

The presence of the smaller features 772 may make the cover assembly 724 more difficult to clean. For example, the smaller features 772 may tend to trap dirt or oil. In some embodiments, the cover assembly 724 may be configured to minimize the number of surface features having a lateral dimension and/or amplitude less than about 500 nm, less than about 400 nm, less than about 300 nm, less than about 250 nm, less than about 200 nm, or less than about 100 nm. In some embodiments, the presence of the smaller features 772 may lead to an increase in the value of the root mean square slope. Therefore, the cover assembly 724 may be configured to have a root mean square slope value which is less than a specified value, such as less than 1. Additional description of suitable values for the root mean square slope is provided with respect to FIG. 2 and, for brevity, will not be repeated here.

The textured region 730, the cover assembly 724, and the glass cover member 754 may be an example of textured region 230, the cover assembly 224, and the glass cover member 254 of FIG. 2 or any other textured regions, cover assemblies, and glass cover members described herein. Details of these textured regions, cover assemblies, and glass cover members are applicable to the textured region 730, the cover assembly 724, and the glass cover member 754 and, for brevity, will not be repeated here.

Figure 8:
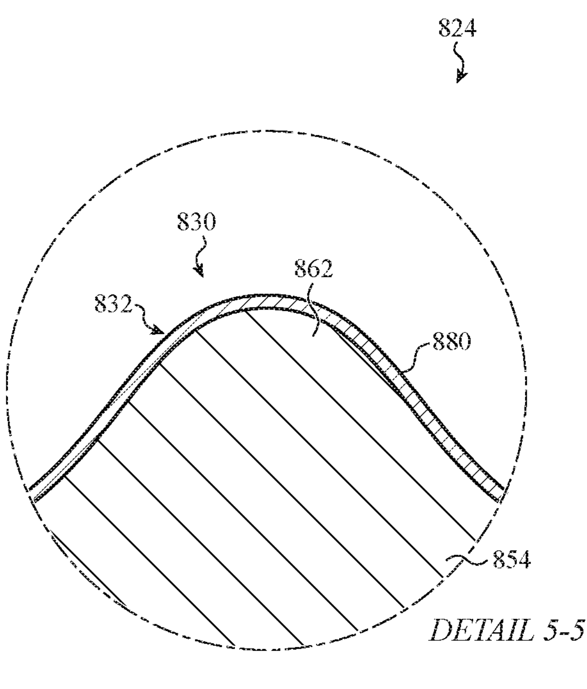
FIG. 8 shows a detail view of an additional example of a textured region.

FIG. 8 shows a detail view of another example of a textured region 830 of a cover assembly 824. For example, FIG. 8 may show an example of the detail region 5-5 of FIG. 5. The scale of FIG. 8 is exaggerated as compared to FIG. 5 in order to better illustrate details of the textured region 830.

The textured region 830 includes a surface feature 862 of the glass cover member 854 and a coating 880 over the surface feature 862. The coating 880 may provide resistance to oils and other deposits on the electronic device and may be referred to as a smudge-resistant coating or an oleophobic coating. The coating 880 may comprise a fluorinated material, such as a fluorinated oligomer or polymer, to impart oleophobic and/or hydrophobic properties. For example, the contact angle of an oil on the coating may be greater than or equal to about 65 degrees or about 70 degrees. As an additional example, the contact angle of water on the coating may be greater than or equal to 90 degrees. The fluorinated material may comprise a linear (non-branched) fluorinated molecule such as a linear fluorinated oligomer or a linear fluorinated polymer.

As shown in FIG. 8, the coating 880 may be thin relative to the height of the surface feature 862. In embodiments, the layer of the fluorinated material is from about 5 nm to about 20 nm thick or from about 10 nm to about 50 nm thick. The layer of the fluorinated material may be bonded directly to the surface features or may be bonded to an intermediate adhesion layer.

The coating 880 and the surface feature 862 together define a surface structure 832. When the coating 880 is applied to the surface features (e.g., surface feature 862) of the glass cover member 854, the textured region 830 of the cover assembly 824 typically comprises a plurality of surface structures. The surface structures may have texture parameters similar to those previously described for the surface features 260 of FIG. 2. For example, the surface structures may be described in terms of areal surface texture parameters such as amplitude parameters, spatial parameters, and hybrid parameters as previously described with respect to FIG. 2. For brevity, details of these texture parameters are not repeated here.

The textured region 830, the cover assembly 824, and the glass cover member 854 may be an example of the textured region 230, the cover assembly 224, and the glass cover member 254 of FIG. 2 or any other textured regions, cover assemblies, and glass cover members described herein. Details of these textured regions, cover assemblies, and glass cover members are applicable to the textured region 830, the cover assembly 824, and the glass cover member 854 and, for brevity, will not be repeated here.

Figure 9:
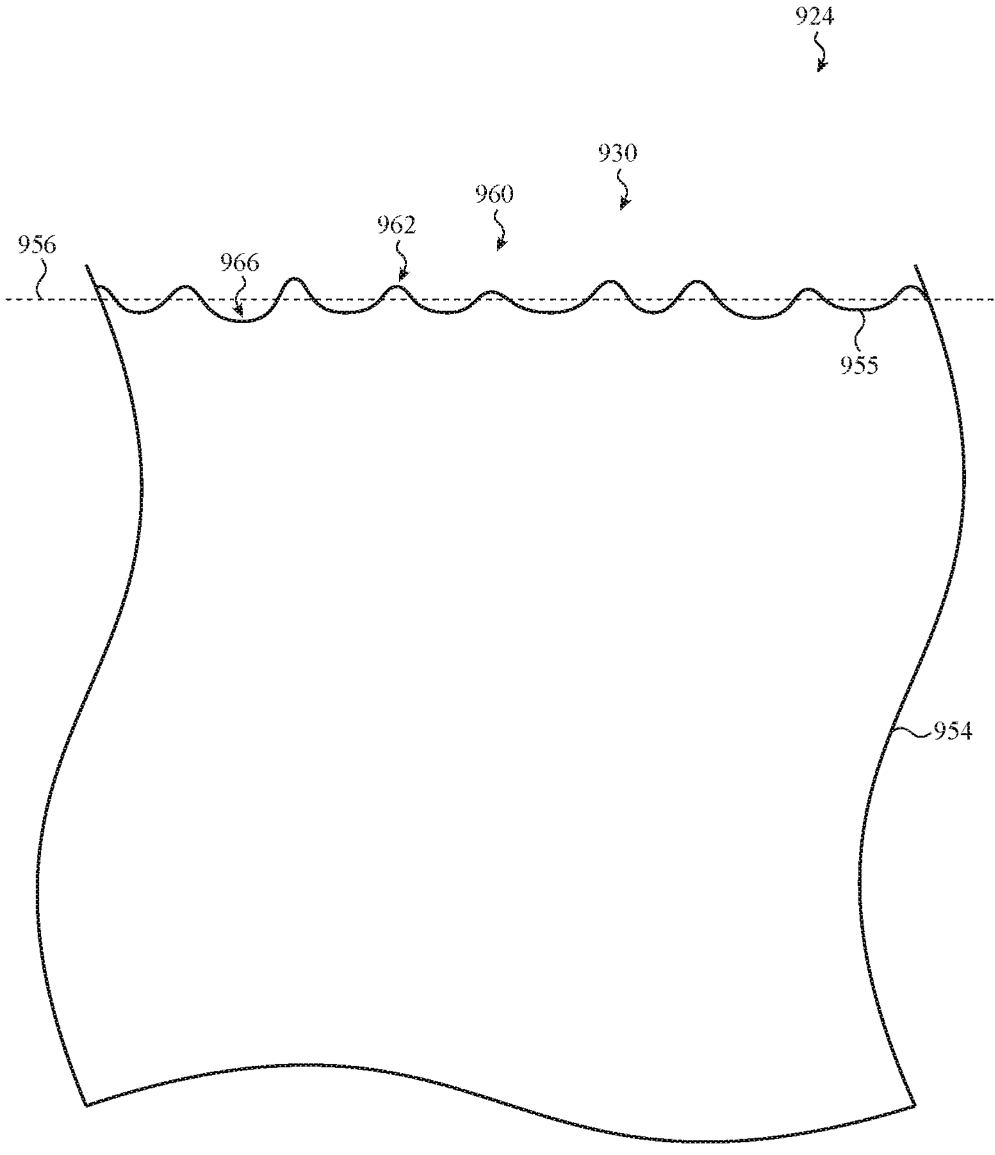
FIG. 9 shows another enlarged partial cross-section view of a cover assembly.

FIG. 9 shows another enlarged partial cross-section view of a cover assembly. As schematically shown in FIG. 9, the textured region 930 of the cover assembly 924 includes surface features 960, such as the surface features 962 and 966. The exterior surface 955 of the glass cover member 954 defines the surface features 960.

As shown in FIG. 9, the glass cover member 954 may define an irregular set of hills and valleys. The irregular set of hills and valleys may have an irregular spacing, such as a non-uniform spacing or a distribution of spacing values, between hill features, valley features, or a combination thereof. The set of hills and valleys may have a random or pseudorandom distribution of spacing values. The heights of the surface features 960 may be measured with respect to a reference surface 956.

The glass cover member 954, the cover assembly 924, and the glass cover member 954 may be an example of the glass cover member 254, the cover assembly 224, and the glass cover member 254 of FIG. 2 or any other glass cover members, cover assemblies, and glass cover members described herein. Details of these glass cover members, cover assemblies, and glass cover members are applicable to the glass cover member 954, the cover assembly 924, and the glass cover member 954 and, for brevity, will not be repeated here.

Figure 10:
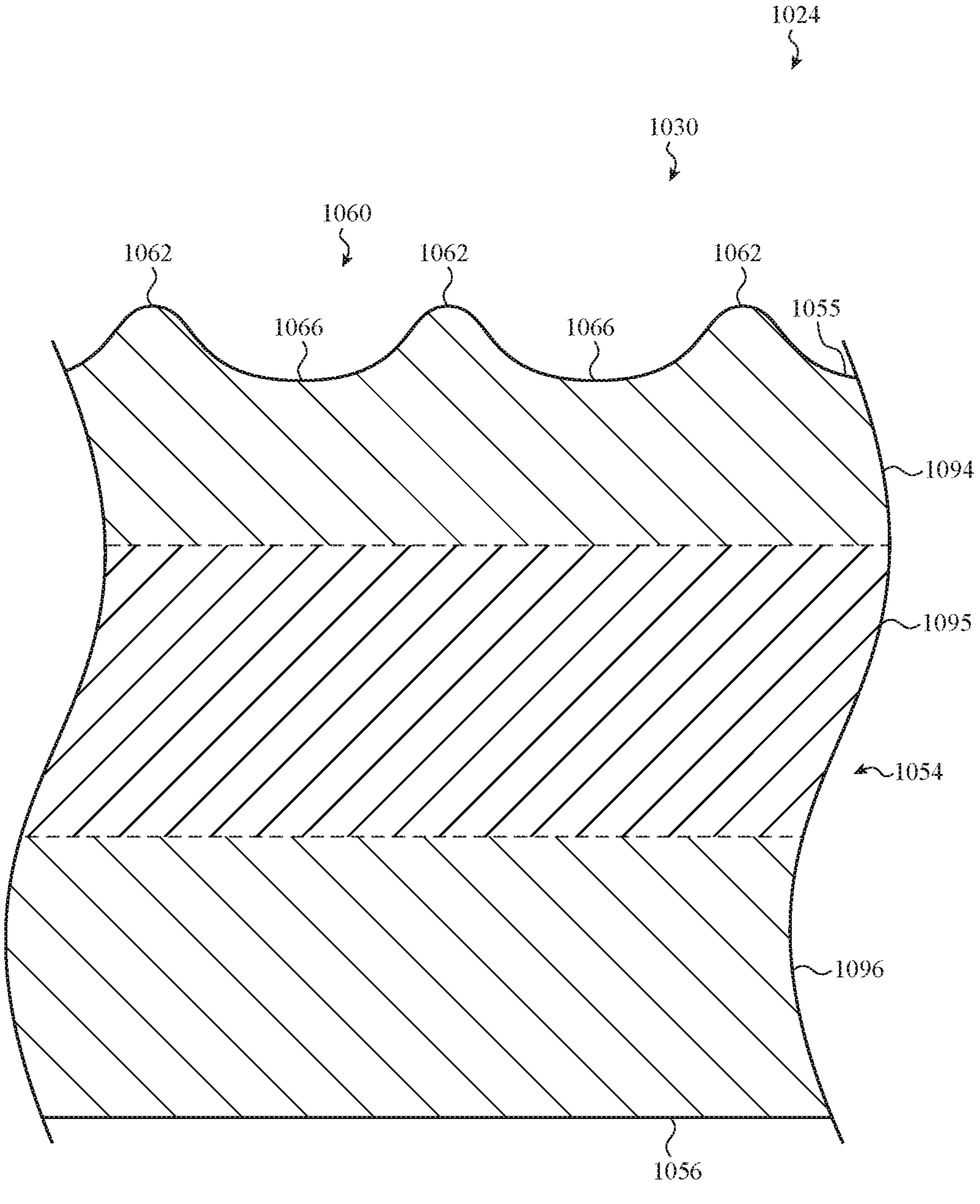
FIG. 10 schematically shows a textured glass cover member after chemical strengthening.

A textured glass cover member may be chemically strengthened by ion-exchange. For example, a glass cover member may be chemically strengthened after the textured surface is formed. FIG. 10 schematically shows a textured glass cover member 1054 after chemical strengthening. As shown in FIG. 10, a compressive stress layer 1094 extends from the textured exterior surface 1055 and a compressive stress layer 1096 extends from the interior surface 1056 of the glass cover member 1054 (not shown to scale). A tensile stress layer 1095 is positioned between the compressive stress layers 1094 and 1096.

As schematically shown in FIG. 10, the textured region 1030 of the cover assembly 1024 includes surface features 1060, such as the surface features 1062 and 1066. The exterior surface 1055 of the glass cover member 1054 defines the surface features 1060. The glass cover member 1054 may be an embodiment of the glass cover member 254 of FIG. 2 or any other glass cover members described herein.

Figure 11:
FIG. 11 shows a flow chart of an example process for forming a textured glass cover component.
Figure 11:
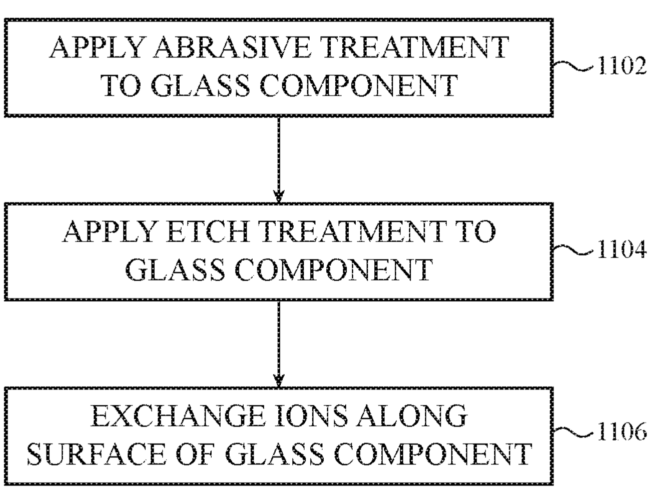

As explained in greater detail with respect to FIG. 11, the ion exchange may involve exchanging smaller ions in an ion-exchangeable glass material for larger ions. The ion exchange may occur within a first ion-exchanged region extending from the textured exterior surface 1055 and a second ion-exchanged region extending from the interior surface 1056. The ion exchange leads to formation of compressive stress layers 1094 and 1096 within these ion-exchanged regions. These ion-exchanged regions of the glass cover member 1054 may be enriched in the larger ions as compared to the glass material in the tensile stress layer 1095.

In the example of FIG. 10, the depth of the compressive stress layers 1094 and 1096 is substantially the same. However, this example is not limiting and in some cases the depth of the compressive stress layer 1094 may be different from that of the compressive stress layer 1096. For example, the depth of the compressive stress layer 1094 may be substantially greater than that of the compressive stress layer 1096. As examples, the depth of the compressive stress layer 1094 may be from 75 microns to 250 microns, from 100 microns to 250 microns, or from 125 microns to 250 microns and the depth of the compressive stress layer 1096 may be from about 5 microns to about 100 microns or from about 5 microns to about 50 microns. In some cases, a compressive stress layer (e.g., 1094 or 1096) may have a depth greater than the depth of any subsurface features resulting from the texturing process. Further description of chemical strengthening is provided with respect to FIG. 11 and the description with respect to FIG. 11 is generally applicable herein.

FIG. 11 shows a flow chart of an example process 1100 for forming a textured glass component, such as a glass cover member. In some cases, the process 1100 may commence after a glass workpiece has been formed to a desired profile shape, such as with a machining, molding or a slumping process.

As shown in FIG. 11, a process 1100 may include applying an abrasive treatment 1102 to a glass component. The abrasive treatment 1102 may comprise directing a stream of abrasive particles at the glass cover member. The abrasive treatment 1102 may be a wet or dry grit blasting process. The abrasive particles may comprise ceramic particles having an average size ranging from about 10 microns to about 75 microns. Following the abrasive treatment 1102, small pits, small fissures, or other such features may be formed along an exterior surface of the glass cover member. A mask, such as a wax or polymer mask, can be used to shield portions of the glass component from abrasive treatment as desired. Optionally, the glass cover member may be washed following abrasive treatment 1102.

The process 1100 may further include applying an etch treatment 1104 to the glass component. The etch treatment 1104 may comprise chemical etching of the glass cover member after the abrasive treatment 1102. Chemical etching techniques for glass cover members may involve using a suitable acid or base (e.g., a hydrofluoric acid-based etchant) to remove portions of the glass cover member. The chemical etching may occur in the liquid phase or in a gas phase. Etching techniques also include reactive ion etching, which may use a mixture of a fluorine containing compound such as $CH_4$, $CHF_3$, $SF_6$ and the like in a gas such as argon or xenon. The etch treatment may etch the glass cover member to a sufficient depth to remove at least some of the small pits, small fissures, or other such features formed during the abrasive treatment 1102. Optionally, the glass cover member may be washed following etch treatment 1104.

Alternately, the textured region of the glass cover component may be formed using other techniques. For example, other techniques for removing a portion of the glass cover member include, but are not limited to, chemical etching, mechanical removal of material such as abrasive treatment, lithography in combination with etching, and combinations thereof.

The process 1100 may include an ion exchange operation 1106, which chemically strengthens the glass cover member. During the ion exchange operation 1106, ions present in the glass material can be exchanged for larger ions in a region extending from a surface of the glass cover member. As previously described with respect to FIG. 10, the ion exchange may form a compressive stress layer extending from a surface of the glass cover member. In some embodiments, a compressive stress layer is formed at each of the textured exterior surface and the interior surface of the glass cover member. A tensile stress layer may be formed between these compressive stress layers, as previously discussed with respect to FIG. 10.

For example, an ion-exchangeable glass material may include monovalent or divalent ions such as alkali metal ions (e.g., $Li^+$, $Na^+$, or $K^+$) or alkaline earth ions (e.g., $Ca^{2+}$ or $Mg^{2+}$) which may be exchanged for other alkali metal or alkaline earth ions. If the glass member comprises sodium ions, the sodium ions may be exchanged for potassium ions. Similarly, if the glass member comprises lithium ions, the lithium ions may be exchanged for sodium ions and/or potassium ions. In embodiments, the compressive stress layer extends to a depth (or thickness) in the glass substrate which is greater than a lowest depth of the surface texture.

In an example, the chemical strengthening process involves exposing the glass cover member to a medium containing the larger ion, such as by immersing the glass cover member in a bath containing the larger ion or by spraying or coating the glass with a source of the ions. For example, a salt bath comprising the ion of interest (e.g., a potassium nitrate bath) may be used for ion exchange. Suitable temperatures for ion exchange are above room temperature and are selected depending on process requirements. The ion exchange process may be conducted at a temperature below the strain point of the glass. The glass cover member may be cooled following the ion exchange operation. Depending on the factors already discussed above, a compression layer as deep as about 10-250 microns can be formed in the glass cover member. The surface compressive stress (CS) may be from about 300 MPa to about 1100 MPa. A mask can be used to shield portions of the glass component from ion exchange as desired. Optionally, the glass cover member is washed after ion exchange operation 1106.

In some cases, a process for forming a textured glass cover member may further include applying a coating to the textured region of the glass cover member. The coating may provide resistance to oils and other deposits on the electronic component and may be referred to as a smudge-resistant coating or an oleophobic coating. The coating may comprise a fluorinated material, such as a fluorinated oligomer or polymer, to impart oleophobic and/or hydrophobic properties, as previously described with respect to FIG. 8. The description provided with respect to FIG. 8 is generally applicable herein and, for brevity, is not repeated here.

The layer of the fluorinated material may be formed through a wet chemistry method or by a vapor deposition method. In embodiments, the layer of the fluorinated material is from about 5 nm to about 20 nm thick or from about 10 nm to about 50 nm thick. The layer of the fluorinated material may be bonded directly to the exterior surface of the glass cover member or may be bonded to an intermediate adhesion layer.

FIG. 12 shows a block diagram of a sample electronic device that can incorporate a textured glass component, such as a textured glass cover member. The schematic representation depicted in FIG. 12 may correspond to components of the devices depicted in FIGS. 1A-10 as described above. However, FIG. 12 may also more generally represent other types of electronic devices with cover assemblies as described herein.

In embodiments, an electronic device 1200 may include sensors 1220 to provide information regarding configuration and/or orientation of the electronic device in order to control the output of the display. For example, a portion of the display 1208 may be turned off, disabled, or put in a low energy state when all or part of the viewable area of the display 1208 is blocked or substantially obscured. As another example, the display 1208 may be adapted to rotate the display of graphical output based on changes in orientation of the device 1200 (e.g., 90 degrees or 180 degrees) in response to the device 1200 being rotated.

The electronic device 1200 also includes a processor 1206 operably connected with a computer-readable memory 1202. The processor 1206 may be operatively connected to the memory 1202 component via an electronic bus or bridge. The processor 1206 may be implemented as one or more computer processors or microcontrollers configured to perform operations in response to computer-readable instructions. The processor 1206 may include a central processing unit (CPU) of the device 1200. Additionally, and/or alternatively, the processor 1206 may include other electronic circuitry within the device 1200 including application specific integrated chips (ASIC) and other microcontroller devices. The processor 1206 may be configured to perform functionality described in the examples above.

The memory 1202 may include a variety of types of non-transitory computer-readable storage media, including, for example, read access memory (RAM), read-only memory (ROM), erasable programmable memory (e.g., EPROM and EEPROM), or flash memory. The memory 1202 is configured to store computer-readable instructions, sensor values, and other persistent software elements.

The electronic device 1200 may include control circuitry 1210. The control circuitry 1210 may be implemented in a single control unit and not necessarily as distinct electrical circuit elements. As used herein, "control unit" will be used synonymously with "control circuitry." The control circuitry 1210 may receive signals from the processor 1206 or from other elements of the electronic device 1200.

As shown in FIG. 12, the electronic device 1200 includes a battery 1214 that is configured to provide electrical power to the components of the electronic device 1200. The battery 1214 may include one or more power storage cells that are linked together to provide an internal supply of electrical power. The battery 1214 may be operatively coupled to power management circuitry that is configured to provide appropriate voltage and power levels for individual components or groups of components within the electronic device 1200. The battery 1214, via power management circuitry, may be configured to receive power from an external source, such as an alternating current power outlet. The battery 1214 may store received power so that the electronic device 1200 may operate without connection to an external power source for an extended period of time, which may range from several hours to several days. The electronic device 1200 may also include a charging assembly, such as a wireless charging assembly.

In some embodiments, the electronic device 1200 includes one or more input devices 1218. The input device 1218 is a device that is configured to receive input from a user or the environment. The input device 1218 may include, for example, a push button, a touch-activated button, capacitive touch sensor, a touch screen (e.g., a touch-sensitive display or a force-sensitive display), capacitive touch button, dial, crown, or the like. In some embodiments, the input device 1218 may provide a dedicated or primary function, including, for example, a power button, volume buttons, home buttons, scroll wheels, and camera buttons.

The device 1200 may also include one or more sensors 1220, such as a force sensor, a capacitive sensor, an accelerometer, a barometer, a gyroscope, a proximity sensor, a light sensor, or the like. The sensors 1220 may be operably coupled to processing circuitry. In some embodiments, the sensors 1220 may detect deformation and/or changes in configuration of the electronic device and be operably coupled to processing circuitry which controls the display based on the sensor signals. In some implementations, output from the sensors 1220 is used to reconfigure the display output to correspond to an orientation or folded/unfolded configuration or state of the device. Example sensors 1220 for this purpose include accelerometers, gyroscopes, magnetometers, and other similar types of position/orientation sensing devices. In addition, the sensors 1220 may include a microphone, acoustic sensor, light sensor, optical facial recognition sensor, or other types of sensing device.

In some embodiments, the electronic device 1200 includes one or more output devices 1204 configured to provide output to a user. The output device 1204 may include display 1208 that renders visual information generated by the processor 1206. The output device 1204 may also include one or more speakers to provide audio output. The output device 1204 may also include one or more haptic devices that are configured to produce a haptic or tactile output along an exterior surface of the device 1200.

The display 1208 may include a liquid-crystal display (LCD), a light-emitting diode (LED) display, an LED-backlit LCD display, an organic light-emitting diode (OLED) display, an active layer organic light-emitting diode (AMOLED) display, an organic electroluminescent (EL) display, an electrophoretic ink display, or the like. If the display 1208 is a liquid-crystal display or an electrophoretic ink display, the display 1208 may also include a backlight component that can be controlled to provide variable levels of display brightness. If the display 1208 is an organic light-emitting diode or an organic electroluminescent-type display, the brightness of the display 1208 may be controlled by modifying the electrical signals that are provided to display elements. In addition, information regarding configuration and/or orientation of the electronic device may be used to control the output of the display as described with respect to input devices 1218. In some cases, the display is integrated with a touch and/or force sensor in order to detect touches and/or forces applied along an exterior surface of the device 1200.

The electronic device 1200 may also include a communication port 1212 that is configured to transmit and/or receive signals or electrical communication from an external or separate device. The communication port 1212 may be configured to couple to an external device via a cable, adaptor, or other type of electrical connector. In some embodiments, the communication port 1212 may be used to couple the electronic device 1200 to a host computer.

The electronic device 1200 may also include at least one accessory 1216, such as a camera, a flash for the camera, or other such device. The camera may be part of a camera assembly which may be connected to other parts of the electronic device 1200 such as the control circuitry 1210.

As used herein, the terms "about," "approximately," "substantially," "similar," and the like are used to account for relatively small variations, such as a variation of +/−10%, +/−5%, +/−2%, or +/−1%. In addition, use of the term "about" in reference to the endpoint of a range may signify a variation of +/−10%, +/−5%, +/−2%, or +/−1% of the endpoint value. In addition, disclosure of a range in which at least one endpoint is described as being "about" a specified value includes disclosure of the range in which the endpoint is equal to the specified value.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A mobile phone comprising:

a display;

an enclosure surrounding the display and including:

a housing;

a front cover assembly positioned over the display, coupled to the housing, and defining a front surface of the mobile phone; and a rear cover assembly coupled to the housing and defining a protrusion and an array of openings that extend through the protrusion, the rear cover assembly comprising:

a first cover member formed from a first glass material that at least partially defines a textured base region of the rear cover assembly, a surface texture of the textured base region having:

a root mean square height (Sq) in a range from 0.25 micrometers to 2 micrometers; and a mean pitch between peaks in a range from 5 micrometers to 20 micrometers;

an interior coating disposed on an interior surface of the first cover member, comprising at least one color layer, and visible through the textured base region of the rear cover assembly; and a second cover member coupled to the first cover member, formed from a second glass material, and at least partially defining a raised surface region of the protrusion and the array of openings; and a plurality of camera modules, each of the camera modules extending into a respective opening of the array of openings.

2. The mobile phone of claim 1, wherein:

the textured base region of the rear cover assembly has a first gloss value; and the raised surface region has a second gloss value that is greater than the first gloss value.

3. The mobile phone of claim 2, wherein the surface texture has a root mean square gradient (Sdq) that is greater than zero and less than 1.

4. The mobile phone of claim 2, wherein:

the rear cover assembly further comprises an oleophobic coating disposed on an exterior surface of the first cover member; and the surface texture of the first cover member and the oleophobic coating together define the textured base region of the rear cover assembly.

5. The mobile phone of claim 1, wherein:

the interior coating is a first interior coating; and the rear cover assembly further comprises a second interior coating disposed on an interior surface of the second cover member, comprising a second color layer, and visible through an exterior surface of the second cover member.

6. The mobile phone of claim 1, wherein the rear cover assembly further comprises a plurality of windows coupled to the second cover member, each window of the plurality of windows positioned over a respective camera module of the plurality of camera modules.

7. The mobile phone of claim 2, wherein a gloss value of the first cover member is in a range from 10 gloss units to 20 gloss units as measured at 60 degrees.

8. A mobile phone comprising:

an enclosure including:

a front cover assembly; and a rear cover assembly comprising:

a first glass cover member defining a surface texture that at least partially defines a first surface region of the rear cover assembly, the surface texture having:

a root mean square height (Sg) in a range from 0.25 micrometers to 2 micrometers; and a root mean square slope (Sdg) in a range from 0.25 to less than 0.75; and a second glass cover member:

at least partially defining a second surface region of the rear cover assembly that protrudes with respect to the first surface region; and defining a plurality of openings that extend through the second glass cover member;

a camera assembly positioned below the second glass cover member and comprising a plurality of camera modules, each camera module of the plurality of camera modules extending into a respective opening of the plurality of openings; and a display positioned below the front cover assembly.

9. The mobile phone of claim 8, wherein the second surface region of the rear cover assembly defines a plateau and has a gloss value that is greater than a gloss value of the first surface region.

10. The mobile phone of claim 9, wherein:

the surface texture of the first glass cover member is a first surface texture; and the second glass cover member defines a second surface texture having a root mean square height (Sq) in a range from 1 nm to 125 nm.

11. The mobile phone of claim 10, wherein the first surface texture has a mean pitch between peaks in a range from 5 microns to 20 microns.

12. The mobile phone of claim 8, wherein:

the first surface region of the first glass cover member produces an amount of transmissive narrow angle scattering in a range from 5% to 30%; and the rear cover assembly further comprises a coating including multiple color layers disposed along an interior surface of the first glass cover member.

13. The mobile phone of claim 8, wherein a gloss value of the first glass cover member is in a range from 5 gloss units to 20 gloss units as measured at 60 degrees.

14. The mobile phone of claim 8, wherein the root mean square slope is in a range from 0.1 to 0.5.

15. A mobile phone comprising:

a display;

a set of camera modules; and an enclosure at least partially surrounding the display and the set of camera modules, the enclosure including:

a first cover assembly positioned over the display and defining a front surface of the mobile phone; and a second cover assembly defining a rear surface of the mobile phone and comprising:

a first glass cover member at least partially defines a textured first surface region of the second cover assembly, the textured first surface region producing a first amount of transmissive haze that is greater than or equal to 50%;

a second glass cover member:

coupled to the first glass cover member;

at least partially defining a protrusion of the second cover assembly, the protrusion defining a second surface region of the second cover assembly that produces second amount of transmissive haze that is less than the first amount of transmissive haze; and defining a set of openings, each camera module of the set of camera modules extending into a respective opening of the set of openings; and a housing coupled to the first cover assembly and the second cover assembly.

16. The mobile phone of claim 15, wherein the first amount of transmissive haze is in a range from 60% to 90%.

17. The mobile phone of claim 15, wherein the second surface region has a gloss value that is greater than the gloss value of the textured first surface region of the second cover assembly.

18. The mobile phone of claim 15, wherein:

each opening of the set of openings extends through the second glass cover member; and the second cover assembly further comprises a set of windows coupled to the second glass cover member, each window of the set of windows positioned over a respective camera module of the set of camera modules.

19. The mobile phone of claim 15, wherein the housing comprises a set of metal segments that are separated by dielectric segments.

20. The mobile phone of claim 15, wherein the textured first surface region has a root mean square height (Sq) in a range from 0.25 micrometers to 2 micrometers.

* * * * *